United States Patent
Radhakrishnan et al.

(10) Patent No.: US 9,976,914 B2
(45) Date of Patent: May 22, 2018

(54) ELECTRONIC DEVICE WITH INTEGRATED TEMPERATURE SENSOR AND MANUFACTURING METHOD THEREOF

(71) Applicants: STMicroelectronics S.r.l., Agrate Brianza (IT); STMicroelectronics Asia Pacific Pte Ltd, Singapore (SG)

(72) Inventors: Praveen Kumar Radhakrishnan, Singapore (SG); Dino Faralli, Milan (IT)

(73) Assignees: STMICROELECTRONICS S.R.L., Agrate Brianza (IT); STMICROELECTRONICS ASIA PACIFIC PTE LTD, Singapore (SG)

( * ) Notice: Subject to any disclaimer, the term of this patent is extended or adjusted under 35 U.S.C. 154(b) by 631 days.

(21) Appl. No.: 14/308,470

(22) Filed: Jun. 18, 2014

(65) Prior Publication Data
US 2014/0369386 A1    Dec. 18, 2014

(30) Foreign Application Priority Data
Jun. 18, 2013    (IT) .............................. TO2013A0502

(51) Int. Cl.
*G01F 1/68* (2006.01)
*B01L 3/00* (2006.01)
(Continued)

(52) U.S. Cl.
CPC .............. *G01K 7/02* (2013.01); *G01F 1/6845* (2013.01); *G01F 1/6888* (2013.01); *Y10T 29/41* (2015.01)

(58) Field of Classification Search
CPC .... G01J 5/10; G01J 5/12; H01L 21/02; G01F 1/68; G01N 33/00; G01N 21/84;
(Continued)

(56) References Cited

U.S. PATENT DOCUMENTS

| 4,542,650 A * | 9/1985 | Renken ................. G01F 1/6965 338/319 |
| 4,548,078 A * | 10/1985 | Bohrer .................... G01F 1/684 257/419 |

(Continued)

FOREIGN PATENT DOCUMENTS

| CN | 201793689 U | * | 4/2011 |
| EP | 0 908 713 A1 | | 4/1999 |

(Continued)

OTHER PUBLICATIONS

Mayer, F. et al., "Scaling of Thermal CMOS Gas Flow Microsensors: Experiment and Simulation", Micro Electro Mechanical Systems, 1996, MEMS '96, Proceedings. An Investigation of Micro Structures, Sensors, Actuators, Machines and Systems. IEEE, the Ninth Annual International Workshop on San Diego, CA, Feb. 11-15, 1996, New York, NY, pp. 116-121.

*Primary Examiner* — Gail Kaplan Verbitsky
(74) *Attorney, Agent, or Firm* — Seed IP Law Group LLP

(57) ABSTRACT

A microfluidic-based sensor, comprising: a semiconductor body, having a first and a second side opposite to one another in a direction; a buried channel, extending within the semiconductor body; a structural layer, of dielectric or insulating material, formed over the first side of the semiconductor body at least partially suspended above the buried channel; and a first thermocouple element, including a first strip, of a first electrical conductive material, and a second strip, of a second electrical conductive material different from the first electrical conductive material, electrically coupled to the first strip. The first thermocouple element is buried in the structural layer and partially extends over the buried channel at a first location. A corresponding manufacturing method is disclosed.

18 Claims, 15 Drawing Sheets

(51) Int. Cl.
  *G01K 7/01*   (2006.01)
  *G01K 7/02*   (2006.01)
  *G01K 13/02*  (2006.01)
  *G01F 1/684*  (2006.01)
  *G01F 1/688*  (2006.01)

(58) Field of Classification Search
  CPC ...... G01N 33/0031; G01N 1/22; G01N 25/18; G01N 1/2247; G01N 2030/324; G01N 2033/0095; G01N 21/53; G01N 21/85; G01N 33/0067; G01N 33/225; G01N 13/02; G01N 2013/024; G01N 2013/026
  USPC .................. 374/121, 45, 179, 170, 178, 141
  See application file for complete search history.

(56) References Cited

U.S. PATENT DOCUMENTS

| | | | | |
|---|---|---|---|---|
| 4,829,818 | A * | 5/1989 | Bohrer | G01F 1/6845 73/204.22 |
| 5,100,479 | A * | 3/1992 | Wise | G01J 5/12 136/220 |
| 5,746,513 | A * | 5/1998 | Renken | G01K 13/00 136/230 |
| 6,526,823 | B2 * | 3/2003 | Tai | G01F 1/6845 73/204.26 |
| 6,557,411 | B1 * | 5/2003 | Yamada | G01F 1/692 73/204.26 |
| 6,616,332 | B1 * | 9/2003 | Renken | G01K 11/12 116/216 |
| 6,684,694 | B2 * | 2/2004 | Fujiwara | G01F 1/6845 73/204.26 |
| 6,703,554 | B2 * | 3/2004 | Morita | G01J 5/12 136/225 |
| 6,803,637 | B2 * | 10/2004 | Benzel | B81C 1/00595 205/656 |
| 6,909,073 | B2 * | 6/2005 | Villa | B01J 19/0093 219/201 |
| 7,233,000 | B2 * | 6/2007 | Nassiopoulou | G01K 7/028 250/338.4 |
| 7,785,002 | B2 * | 8/2010 | Dewes | G01K 7/028 136/200 |
| 7,793,410 | B2 * | 9/2010 | Padmanabhan | G01F 1/684 29/417 |
| 7,905,140 | B2 * | 3/2011 | Kanne | B01L 3/502707 73/204.26 |
| 8,286,478 | B2 * | 10/2012 | Speldrich | G01F 1/6845 73/204.23 |
| 8,921,792 | B2 * | 12/2014 | Quad | G01J 5/0225 250/338.4 |
| 9,444,027 | B2 * | 9/2016 | Dibra | H01L 35/32 |
| 9,513,240 | B2 * | 12/2016 | Lin | G01N 25/48 |
| 2002/0121137 | A1 * | 9/2002 | Fujiwara | G01F 1/6845 73/204.26 |
| 2003/0133489 | A1 * | 7/2003 | Hirota | G01J 5/08 374/121 |
| 2004/0206749 | A1 * | 10/2004 | Villa | B01J 19/0093 219/521 |
| 2008/0210001 | A1 * | 9/2008 | Kanne | B01L 3/502707 73/204.17 |
| 2010/0330721 | A1 * | 12/2010 | Barlocchi | B01L 3/502707 438/49 |
| 2011/0063772 | A1 * | 3/2011 | Steger | H01L 21/6831 361/234 |
| 2011/0155913 | A1 * | 6/2011 | Noguchi | G01J 5/0022 250/338.3 |
| 2011/0235678 | A1 * | 9/2011 | Kurtz | G01K 7/183 374/185 |
| 2012/0163410 | A1 * | 6/2012 | Tsuchiya | G01J 5/0225 374/121 |
| 2012/0192644 | A1 * | 8/2012 | Asano | G01F 1/6845 73/204.26 |
| 2013/0081662 | A1 * | 4/2013 | Dibra | H01L 35/32 136/203 |
| 2014/0092935 | A1 * | 4/2014 | Lin | G01N 25/4893 374/10 |
| 2014/0209141 | A1 * | 7/2014 | Fornara | H01L 27/16 136/205 |
| 2014/0284753 | A1 * | 9/2014 | Ishitsuka | G01F 1/69 257/467 |
| 2015/0054114 | A1 * | 2/2015 | Quad | G01J 5/0225 257/467 |
| 2015/0177069 | A1 * | 6/2015 | Maes | G01J 5/023 374/121 |
| 2016/0114319 | A1 * | 4/2016 | McGuinness | B01L 3/502715 435/287.2 |

FOREIGN PATENT DOCUMENTS

| | | | | |
|---|---|---|---|---|
| EP | 2288887 A1 | * | 3/2011 | ......... A41D 19/0027 |
| JP | 2001149059 A | * | 6/2001 | |
| JP | 2003035611 A | * | 2/2003 | |
| KR | 200611951 A | * | 2/2006 | |
| WO | 98/50763 A1 | | 11/1998 | |
| WO | 03/062134 A1 | | 7/2003 | |
| WO | WO 2006046308 A1 | * | 5/2006 | ........ H01L 21/67115 |

\* cited by examiner

ELECTRONIC DEVICE WITH INTEGRATED TEMPERATURE SENSOR AND MANUFACTURING METHOD THEREOF

BACKGROUND

Technical Field

The present disclosure relates to an electronic device having an integrated temperature sensor, and to a manufacturing method of the same. In particular, the one or more embodiments of present disclosure relates to a microfluidic-based electronic device having at least one integrated thermocouple and at least one microchannel.

Description of the Related Art

Devices for handling fluids, comprising at least one micro-channel in a substrate, e.g., a device of the "Lab-On-Chip" (LOC) type, can be used, inter alia, for analyzing or transporting very small quantities of liquids or to subject said fluids to biological or chemical reactions. Devices of this type may also be simple devices with a single duct, such as e.g., used for a flow sensor. Micro-channels in Lab-on-Chip and Point-of-Care (POC) systems specify flow control to be very accurate when delivering fluid to a processing center (e.g., an analyzer) or when retrieving fluid from a reservoir.

In fluid flow meters, one aim is to achieve optimal mass flow readings across a micromachined chip; to this end, it is highly desirable to have a uniform and laminar flow. In the known art, this is currently achieved at the packaging level.

The known art has a number of drawbacks. In particular, in thermal fluid flow meters, laminar flow conditions are not always optimally controlled at packaging level, thus dissipating a relatively high amount of heat into a turbulent flow (this makes the flow sensor less sensitive). A thermal sensor of this type, therefore, does not provide reliable results of the measured flow temperature.

Moreover, thermoelectric infrared (IR) sensors are known in the art to exploit thermocouples in order to reveal IR radiations. A thermocouple includes two different materials which are connected at one end, while the other two ends are attached to a voltage meter. If there is a temperature difference between the common junction and the thermocouple ends connected to the voltmeter, then a thermo-voltage is revealed. The magnitude of the thermo-voltage is a function of the temperature difference. If an IR radiation, coming from an external object, is collected at the thermocouple common junction, the thermocouple junction warms up in response to the incident IR radiation. In this way, it is possible to reveal the IR radiation by sensing the thermo-voltage generated by the thermocouple. However, cooling a thermocouple junction typically employs thermal dissipaters at packaging level which increase the final size of the package and does not provide for an optimal level of integration.

BRIEF SUMMARY

One or more embodiments of the present disclosure is to provide an electronic device having an integrated temperature sensor which is reliable, cost effective, and of reduced dimensions. The electronic device may be used for a plurality of applications, in particular as a flow meter and an IR sensor.

Furthermore, the electronic device according to one embodiment of the present disclosure has at least one microchannel achieving laminar flow at die level and the microchannel have integrated flow feed-back provided by the presence of the thermocouple(s). In fact, by operating the temperature sensor as a thermal flow-meter, the flow within the microchannel can be controlled via real-time feedback with no additional components required. The packaging is therefore considerably simplified.

According to one embodiment of the present disclosure it is provided an electronic device having an integrated temperature sensor and a manufacturing method thereof, as defined in the attached claims.

BRIEF DESCRIPTION OF THE SEVERAL VIEWS OF THE DRAWINGS

For a better understanding of the disclosure, preferred embodiments thereof are now described, purely by way of non-limiting example and with reference to the annexed drawings, wherein.

DETAILED DESCRIPTION

FIGS. 1-10 shows steps of a process of fabrication of one or more channels in a semiconductor body, according to an embodiment of the present disclosure. The channels may belong, for example, to a LOC ("Lab-On-Chip") device, and are configured in such a way to allow laminar flow of a fluid passing through them.

According to the manufacturing steps of FIGS. 1-10, the microchannels have, in a cross section view, a substantially rectangular shape.

Figure 1:
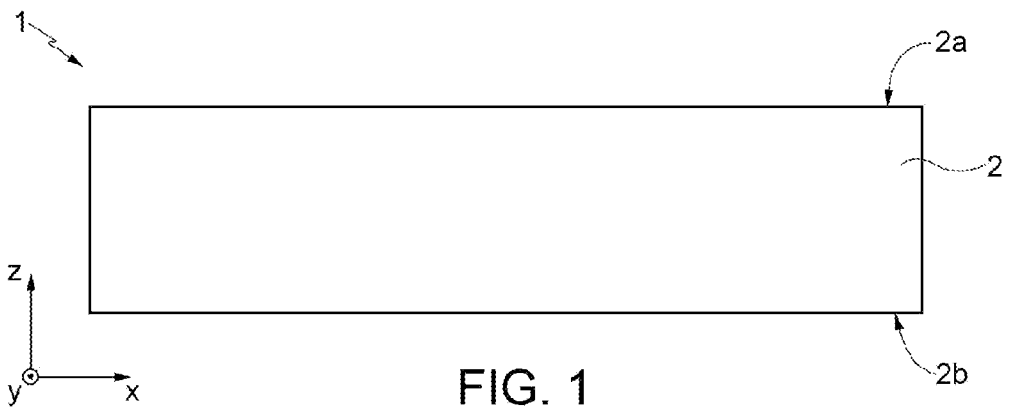
FIGS. 1-10 show, in a cross section view, manufacturing steps of a microfluidic-based electronic device according to an embodiment of the present disclosure.

With reference to FIG. 1, it is provided a wafer 1 (here, only a portion of the wafer is shown, still referenced with number 1). Wafer 1 includes a substrate 2, of semiconductor material, in particular silicon (Si). Substrate 2 has a top side 2a and a bottom side 2b opposite to one another along a first direction Z. More in particular, top side 2a and bottom side 2b of substrate 2 lie on respective planes which parallel to a plane XY, the plane XY being defined by orthogonal directions X and Y, which are moreover orthogonal to direction Z.

Figure 2:
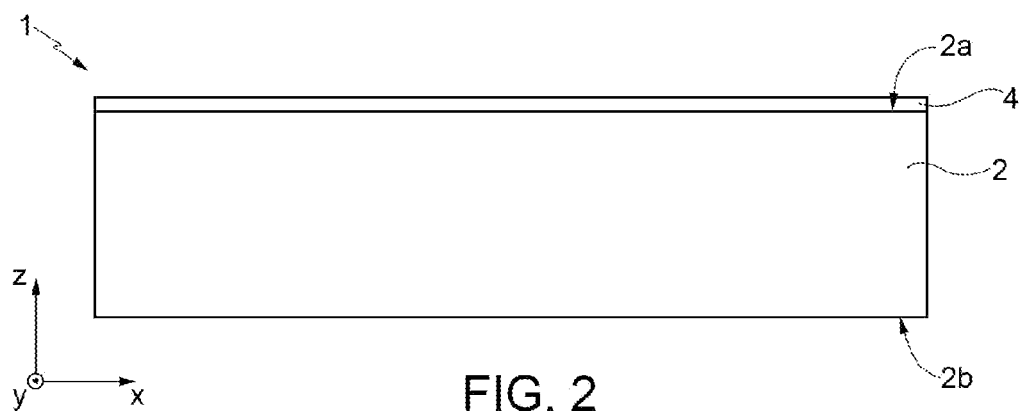

With reference to FIG. 2, a first dielectric (or insulating) layer 4 is formed on the top side 2a of the substrate 2, covering the entire top side 2a. The first dielectric layer 4 is, in particular, a silicon oxide ($SiO_2$) layer formed by deposition technique. Alternatively, the first dielectric layer 4 is a silicon oxide ($SiO_2$) layer thermally grown on the top side 2a of substrate 2. The first dielectric layer 4, which may also be of any other insulating material typically accepted in the semiconductor fabrication plants, has a thickness, measured in Z direction, from 0.5 µm to 2 µm, in particular equal to 1 µm. In any case, the thickness of the first dielectric layer 4 should be selected in such a way to have low (e.g., close to zero) stress in the resulting membrane and at the same time low thermal conductivity.

Reynolds number is below the turbulent limit (e.g., below a Reynolds number of 2100, preferably below 500).

Table 1 below provides examples dimensions of the channel and example parameters for exemplary fluids of water and air at varying temperatures.

TABLE 1

Exemplary Parameters for Creating Reynolds Numbers Below 2100.

| Parameter | Air | Water |
|---|---|---|
| Temp: 40 C. | | |
| Diameter of the channel (m) | $100 \times 10{-6}$ to $100 \times 10{-4}$ (typical: $50 \times 10{-5}$) | |
| Average velocity of the flow (m/s) | $1 \times 10{-6}$ to $100 \times 10{-6}$ (typical: $50 \times 10{-6}$) | $1 \times 10{-6}$ to $100 \times 10{-6}$ (typical: $50 \times 10{-6}$) |
| Density (kg/m3) | 1.1455 | 992.2 |
| Shear viscosity (kg/m · s) | Depends on y - thickness of the various strata of the flow which cannot be specified without some Finite element analysis. | |
| Temp: 0 C. | | |
| Diameter of the channel (m) | $100 \times 10{-6}$ to $100 \times 10{-4}$ (typical: $50 \times 10{-5}$) | |
| Average velocity of the flow (m/s) | $1 \times 10{-6}$ to $100 \times 10{-6}$ (typical: $50 \times 10{-6}$) | $1 \times 10{-6}$ to $100 \times 10{-6}$ (typical: $50 \times 10{-6}$) |
| Density (kg/m3) | 1.2922 | 999.8395 |
| Shear viscosity (kg/m · s) | Depends on y - thickness of the various strata of the flow which cannot he specified without some Finite element analysis. | |

Figure 3:
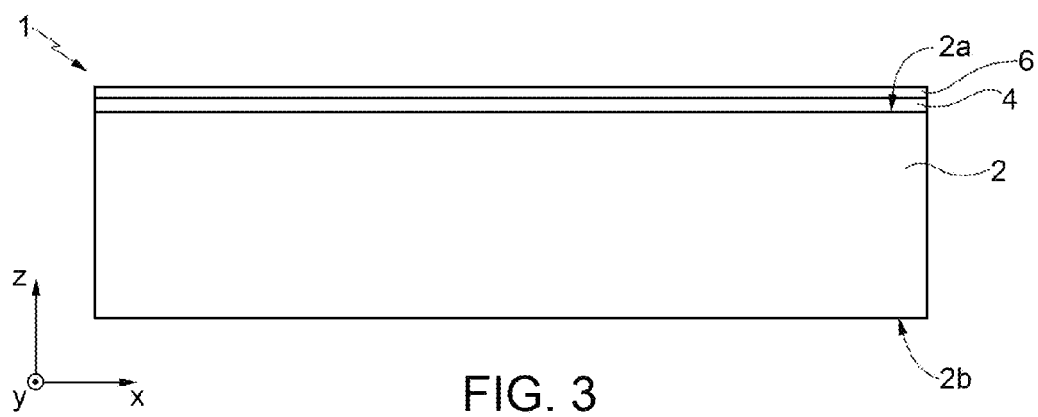

With reference to FIG. 3, on the first dielectric layer 4 it is formed a second dielectric (or insulating) layer 6, of a material which can be removed, or etched, selectively with respect to the first dielectric material 4. For example, the second dielectric layer 6 is of silicon nitride (SiN). The second dielectric layer 6 has a thickness, measured in Z direction, from 0.1 µm to 2 µm, in particular equal to 0.2 µm. In any case, the thickness of the second dielectric layer 6 should be such as to compensate the stress that may be induced by the first dielectric layer 4.

Figure 4A:
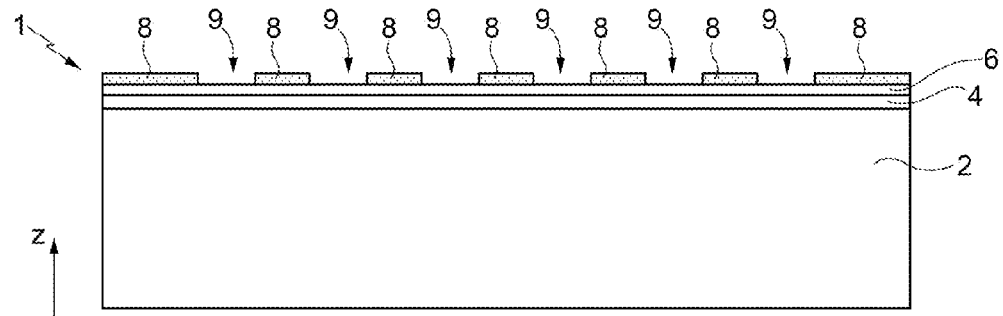
Figure 4B:
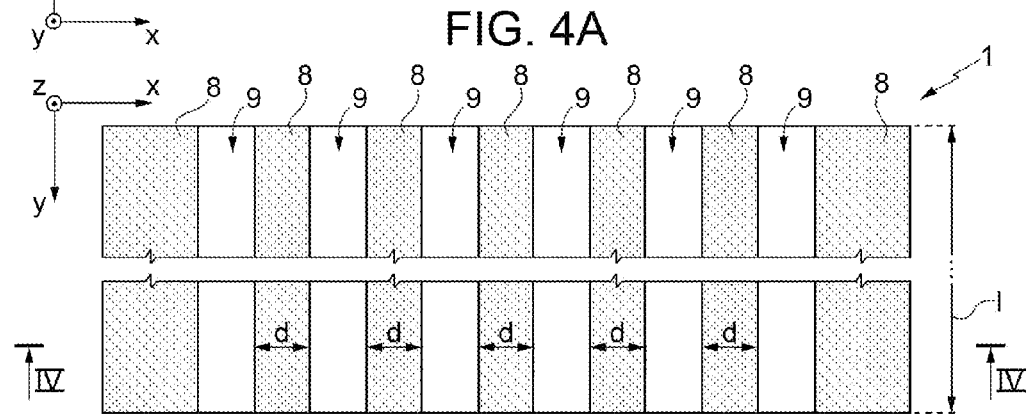

With reference to FIG. 4A, a photoresist layer is formed on the second dielectric layer 6 and defined by means of photolithographic technique so as to open a plurality of apertures 9 and form a mask (indicated again with reference number 8) for subsequent etching steps. The apertures 9 expose respective superficial portions of the second dielectric layer underneath. FIG. 4B shows a top view of the wafer 1 of FIG. 4A. In particular, the cross section of FIG. 4A is taken along the cut-line IV-IV of FIG. 4B. The plurality of apertures 9 have, in top view, a substantial rectangular shape, with principal extension along Y direction. However, it is apparent apertures 9 may have any suitable form and dimension.

According to an embodiment of the present disclosure, apertures 9 adjacent along X direction are spaced from one another of a distance d in the range 1 µm-5 µm, for example 2 µm. In other words, the distance d is the length (along X direction) of the portion of the mask 8 extending between adjacent apertures 9.

The distance d may be dependent on the initial thickness of the substrate and the targeted size of the buried channel, if wet etching is used. The distance d may also be chosen in a range which is appropriate to contain as many thermocouples as is specified by the particular application. Moreover, apertures 9 have respective length l, along Y direction, in the range of 500 µm-2000 µm, for example 1000 µm. The value of length l may be dependent on the dimensions of a channel 14, which is designed in such a way that the With reference to FIG. 5, a first etching step is carried out to remove selective portions of the second dielectric layer 6 exposed through the mask 8; if the second dielectric layer is of silicon nitride, the etching step can be carried out by means of wet chemical or dry plasma etch. This etching step allows removal of the portion of the second dielectric layer 6 but it does not remove the first dielectric layer 4 beneath. The first dielectric layer 4 acts as an etch stop layer.

Figure 5A:
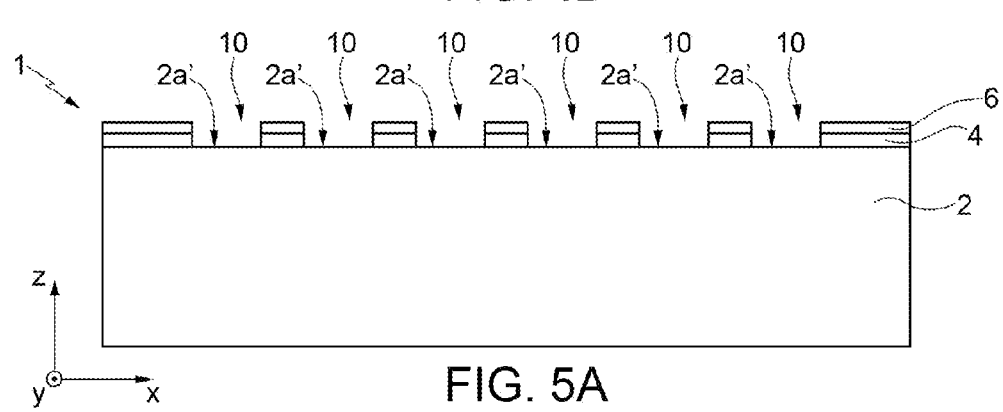

A second etching step is carried out to remove selective portions of the first dielectric layer 4 exposed through the mask 8 and through the etched portions of the second dielectric layer 6. In this way, portions 2a' of the top surface 2a of the substrate 2 are exposed through trenches 10, as shown in FIG. 5.

Figure 5B:
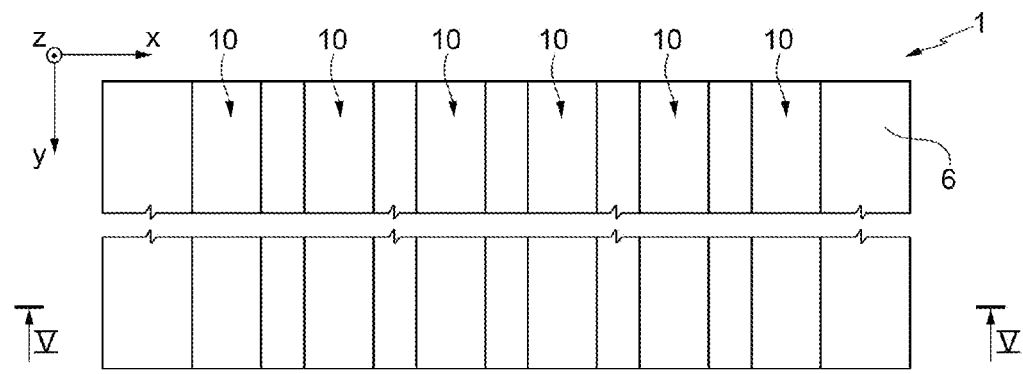

As it is apparent to the skilled person in the art, the shape of the trenches 10 are analogous to those of apertures 9 in the mask 8; however, dimensions of trenches 10, along X and Y directions, may be higher than corresponding dimensions of apertures 9, since, during the first and second etching step, a certain degree of under etch may be observed. Accordingly, when designing the mask 8, the possible underetch is to be taken into account, as it is apparent to the skilled person. The minimum distance d', along X direction, representing the distance of a trench 10 from the adjacent trench 10, when considered from the top view of FIG. 5B, is lower than the respective distance d measured on the mask 8 of FIG. 4B, and is below 2 µm, in particular d' is equal to 0.2 µm.

Figure 6:
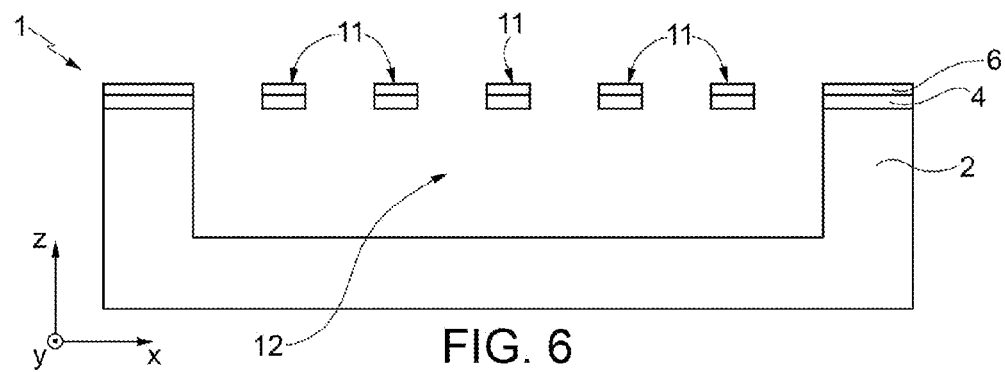

With reference to FIG. 6, a third etching step is carried out, to remove a portion of the substrate 2 where a channel is to be formed. This etching step is carried out by a dry plasma etching. During this third etching step, the trenches 10 form passages for the etching chemical solution, which reacts with the exposed portions of the substrate 2. The etching, which is, in this case, anisotropic (directional along Z direction), proceeds in depth into the substrate 2, forming a channel 12 within the substrate 2. The channel 12 has a lateral wall 12a and a bottom wall 12b, and, in cross section view, a substantial rectangular shape. The portions of the first and second dielectric layers 4, 6 extending above the channel 12 form suspended beams 11. When the substrate 2 is of silicon, the isotropic etchant is, for example, a $SF_6$-based gas phase etchant.

Figure 7:
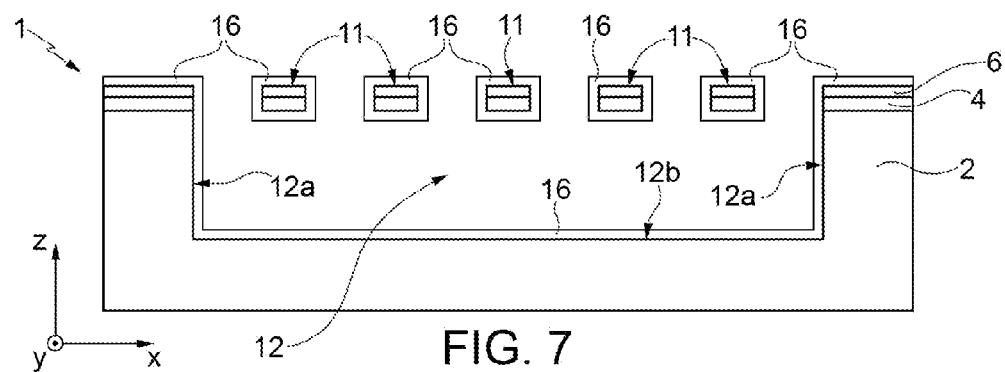
Figure 8:
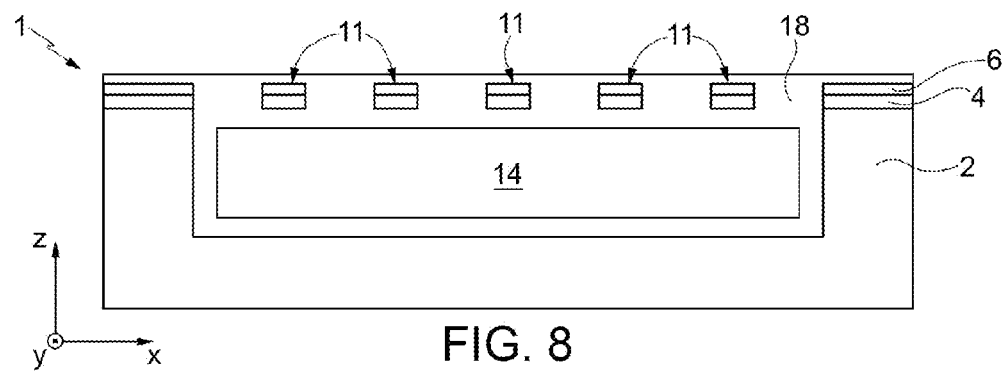

According to FIGS. 7 and 8, further steps are directed to cover the channel 12, thus forming a buried channel 14, as shown in FIG. 8.

In more details, FIG. 7, the wafer 1 is placed in a deposition chamber (not shown), and a polysilicon deposition step is carried out. The polysilicon is deposited by means of PECVD or LPCVD and uniformly covers the inner walls of the channel 12 (lateral wall 12a and bottom wall 12b), and also the suspended beams 11. In particular, as shown in FIG. 7, a substantially uniformly thick covering layer 16, of polysilicon, is formed within the channel 12, all around the suspended beams 11, and on remaining exposed portions of the wafer 1. The covering layer 16 has a thickness from 0.5 µm to 2.5 µm, in particular equal to 0.5 µm.

According to different embodiments, the covering layer 16 may be of a material other than polysilicon, which can be oxidized.

With reference to FIG. 8, a thermal oxidation step is carried out, to oxidize the covering layer 16 and to grow an oxide layer 18 which uniformly covers the inner walls 12a and 12b of the channel 12, and completely fills the spaces between adjacent beams 11. The buried channel 14 is thus formed. In the embodiment disclosed, where the covering layer 16 is of polysilicon, the oxide layer 18 is a polysilicon oxide layer, grown using a thermal process. In particular, the wafer 1 is set in a growth chamber, at a temperature of about 900° C. in presence of a gas including $N_2$ or $O_2$ or $O_2/H_2$ or DCE, for a time equal to about 35 min.

It is noted that, given the relatively low thickness of the covering layer 16, the thermal oxidation step to form oxide layer 18 is self-controlled in the sense that, when substantially all the polysilicon material of the covering layer 16 has reacted with the oxygen-based gas supplied to the growth chamber, the oxide growth naturally comes to an end. Alternatively, the oxide-growing step may be monitored and stopped when the channel 12 is completely covered.

The oxide layer 18 is also formed in other regions of the wafer 1, in particular, where the previously formed covering layer 16 is present.

The oxide layer 18 may be formed using a different technique, for example a deposition technique, depositing silicon oxide ($SiO_2$). Alternatively, another material, different from an oxide, may be used, for example silicon nitride (SiN). Accordingly, independent from the material used, the layer 18 is more generally a structural layer 18 which has the function of filling the spaces between the beams 11 in such a way to completely cover the channel 12 and forming the buried channel 14. The structural layer 18, moreover, covers the internal walls 12a, 12b of the channel 12. The material of the structural layer 18 may be chosen according to the type of fluid which, during use, is supplied to the buried channel 14. In particular, specifications such as biological compatibility may be taken into account. Silicon oxide and polysilicon oxide guarantee biological compatibility.

Figure 9:
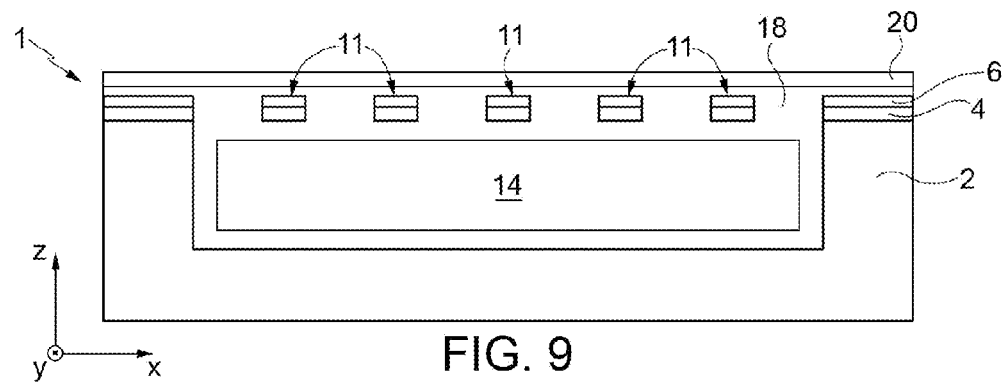

With reference to FIG. 9, a third dielectric (or insulating) layer 20 is formed on the wafer 1, above the structural layer 18. The third dielectric layer 20 is, for example, of silicon nitride (SiN), formed by deposition technique, and having a thickness in the range 1 µm-2 µm, for example equal to 1 µm. In any case, the thickness of the third dielectric layer 20 is appropriate to compensate for the stress which may be induced by the layer 18.

Figure 10:
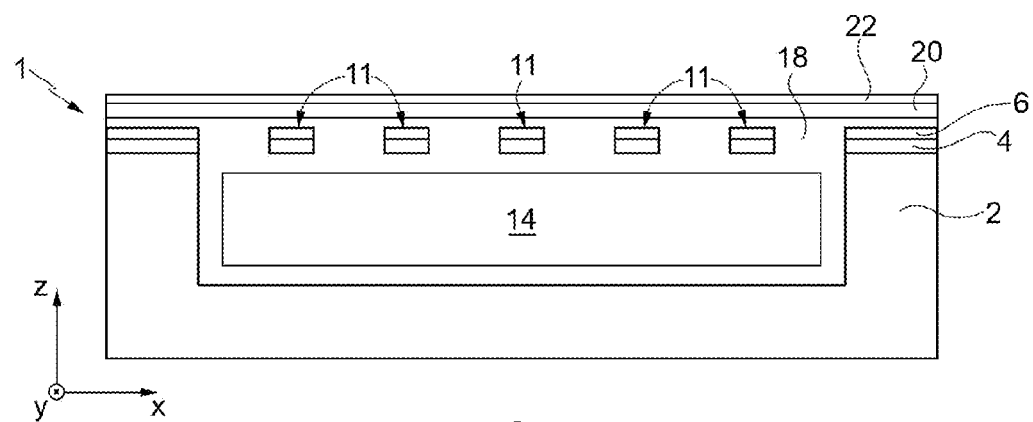

With reference to FIG. 10, a fourth dielectric (or insulating) layer 22 is formed on the wafer 1, above the third dielectric layer 20. The fourth dielectric layer 22 is, for example, of silicon oxide ($SiO_2$), formed by deposition technique, and having a thickness in the range 0.5 µm-3 µm, for example equal to 1 µm. In any case, the thickness of the fourth dielectric layer 22 may be appropriate to compensate for the stress which may be induced by the layer 20.

Figure 11:
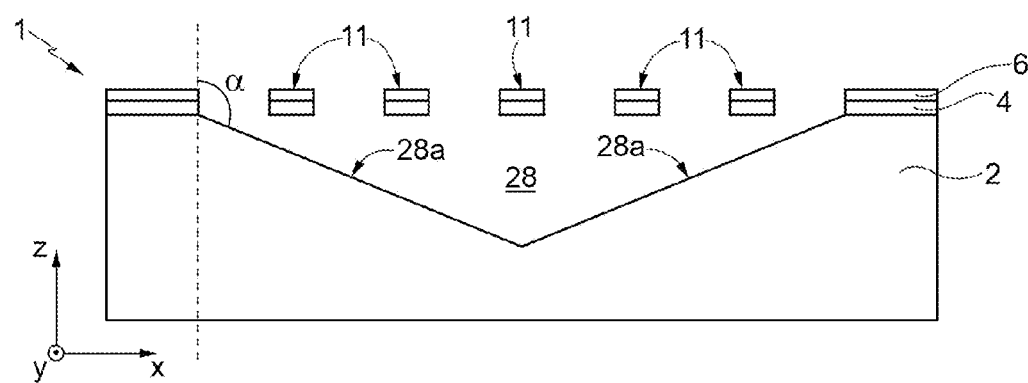
FIGS. 11 and 12, in a cross section view, respective alternatives to the embodiment of FIGS. 1-10.
Figure 12:
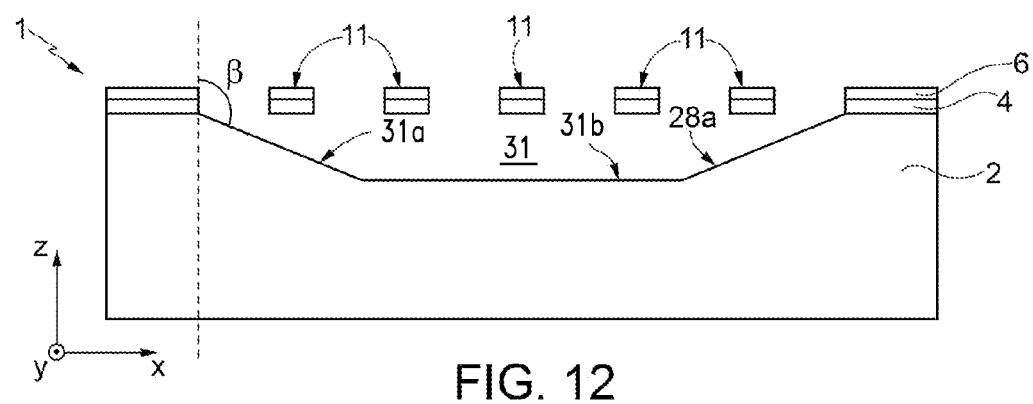

FIGS. 11 and 12 show respective cross section views of channels formed in the wafer 1 according to respective embodiments, alternative to the embodiment shown in FIG. 6. According to the embodiments of FIGS. 11 and 12, the micro-channels have, in a cross section view, a substantially triangular shape and trapezoidal shape.

According to FIG. 11, after the manufacturing steps of FIGS. 1-5B, the wafer 1 undergoes an anisotropic etching step, to selectively remove portions of the substrate 2 where the channel 12 (or, analogously, buried channel 14) has to be formed. The substrate 2 is etched through the trenches 10, which expose superficial portions 2a' of the substrate 2. The etching is, in this case, anisotropic, and proceeds in depth into the substrate 2, forming a channel 28 within the substrate 2. The channel 28 has lateral walls 28a which meet one another at an intersection point 28b. Accordingly, in cross section view, the channel 28 has a substantially triangular shape. The lateral walls 28a form, with the direction Z, an angle α of about 54.7 degrees. The portions of the first and second dielectric layers 4, 6 extending above the channel 12 form suspended beams 11, analogous to what has already been described with reference to FIG. 6. When the substrate 2 is of silicon, the anisotropic etchant is, for example, potassium hydroxide (KOH) or Tetramethylammonium hydroxide (TMAH). The crystallographic plane exposed at the lateral walls 28a is the plane <100>.

According to the further embodiment of FIG. 12, it is possible to use an alternative isotropic etchant, so as to shape the channel differently. As shown in FIG. 12, which is alternative to FIG. 11, the substrate 2, of silicon, is etched using KOH or TMAH, thus forming a channel 31 having a lateral wall 31a and a bottom wall 31b. The lateral wall 31a forms, with the direction Z, an angle β of about 54.7 degrees, exposing the <100> crystallographic plane. The etching step is stopped in such a way that, in cross section view, the channel 31 has a substantially trapezoidal shape, with suspended beams 11.

According to further embodiments, not shown, the buried micro-channel 14/28/31 may have other shapes, such as oval or circular.

Irrespective of the particular cross section geometry of the buried channel, to have laminar flow, the Reynold number "Re" should be such that: Re=(u·l·F)/i where "u" is the average velocity of the flow (using meters/sec), "1" is the diameter of the channel (using meters), "F" is the density (in kg/m³) of the fluid, and "i" is the shear viscosity of the fluid (in kg/ms). Fluid flow in microchannels having a low Reynolds number (typically lower than 2100) is laminar. According to an aspect of the present disclosure, given a certain liquid to be supplied to the channel 14/28/31, the channel 14/28/31 is configured or designed in such a way to have a Reynolds number well below 2100, in particular lower than 1000, preferably lower than 500, e.g., equal to about 100.

Micro-pumps may be used to drive the fluid through the microchannel (to create a high pressure drop), for example integrating a pump at the system level. The pumping strength may influence the velocity of the fluid flow, but this is controllable, as it can be appreciated by the skilled technician, in order to not increase the Reynolds number "Re" over the laminar-flow threshold value.

Irrespective of the shape of channel 28 or channel 31 according to the embodiment of FIG. 11 and, respectively, FIG. 12, the manufacturing process continues as already described with reference to FIGS. 7-10, obtaining a respective buried channel having triangular or trapezoidal shape in cross section view. The manufacturing steps for forming the buried channel are the same as already disclosed with reference to FIGS. 7-10 and therefore, they are no further discussed.

FIGS. 13-26 shows steps of a process of fabrication of one or more channels in a semiconductor body, according to a still further embodiment of the present disclosure. The channels belongs, for example, to a LOC ("Lab-On-Chip") device, and are configured in such a way to allow laminar flow of a fluid passing through them.

Figure 13:
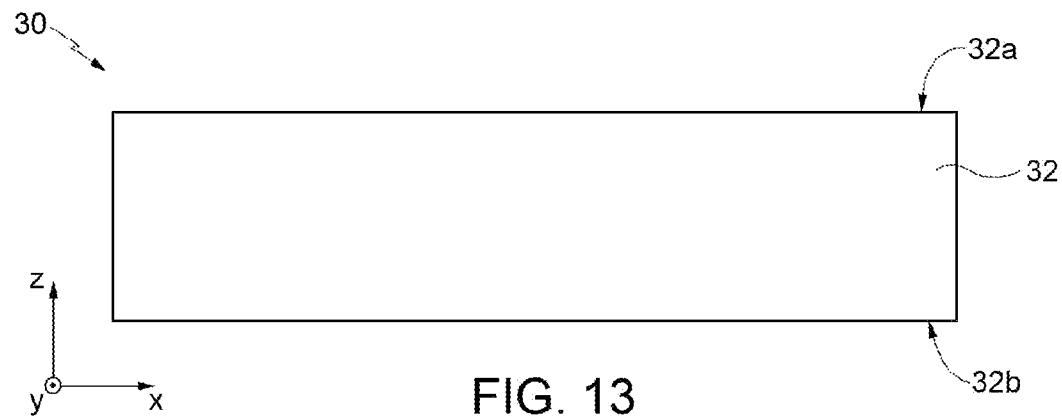
FIGS. 13-26 show, in a cross section view, manufacturing steps of a further embodiment of the present disclosure, alternative to the embodiments of FIGS. 1-12.

With reference to FIG. 13, it is provided a wafer 30, including a semiconductor body 32 having a front side 32a and a back side 32b opposite to one another along a direction z. The semiconductor body 32 is, for example of silicon (Si).

Figure 14A:
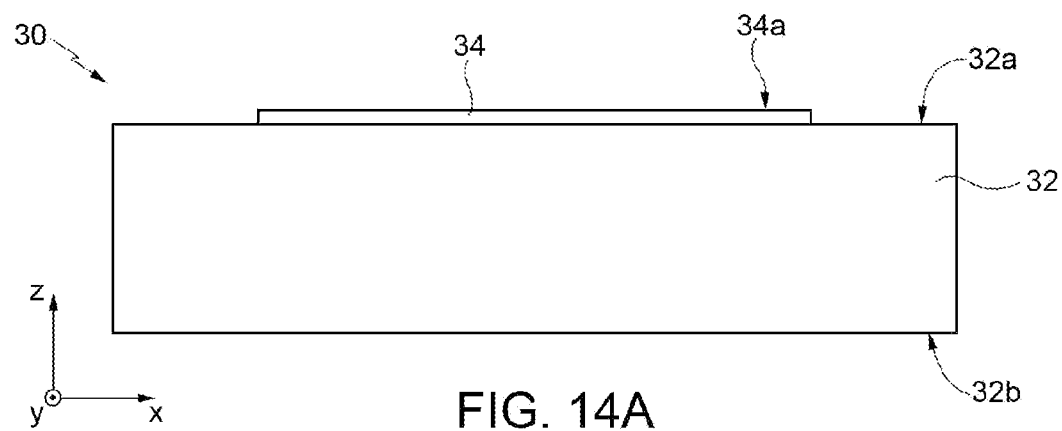

With reference to FIG. 14A, a sacrificial layer is formed on the front side 32a of the semiconductor body 32 and subsequently defined by, e.g., photolithographic technique, to form a sacrificial island 34. The sacrificial island 34 exposes a top surface 34a. The material of the island 34 can be chosen as desired, for example the island 34 is of polysilicon. According to an aspect of the present disclosure, the thickness of the sacrificial island 34, measured in Z direction, ranges between 0.5 µm and 2 µm, for example equal to 1 µm.

Figure 14B:
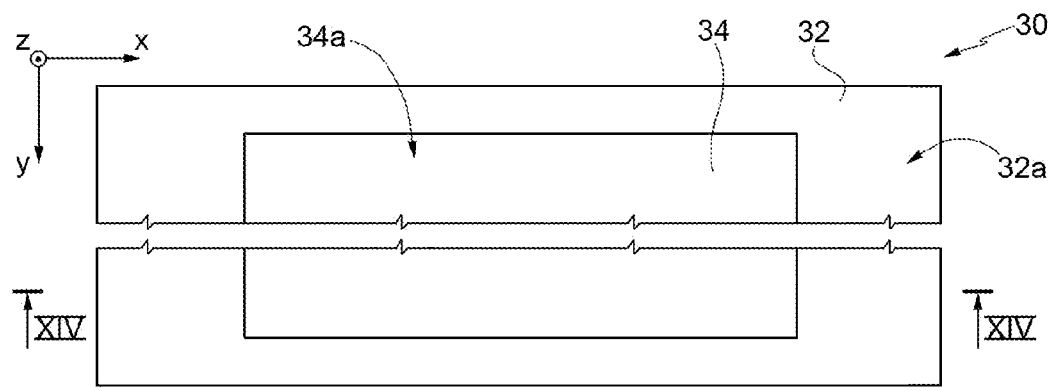

FIG. 14B shows, from a top view, the wafer 30, where it can be appreciated that the island 34 has a substantially square shape. Alternatively, the island 34 may have rectangular shape, or polygonal shape, or circular shape, as desired. FIG. 14A is a cross section view of FIG. 14B, taken along the section line XIV-XIV of FIG. 14B.

Figure 15:
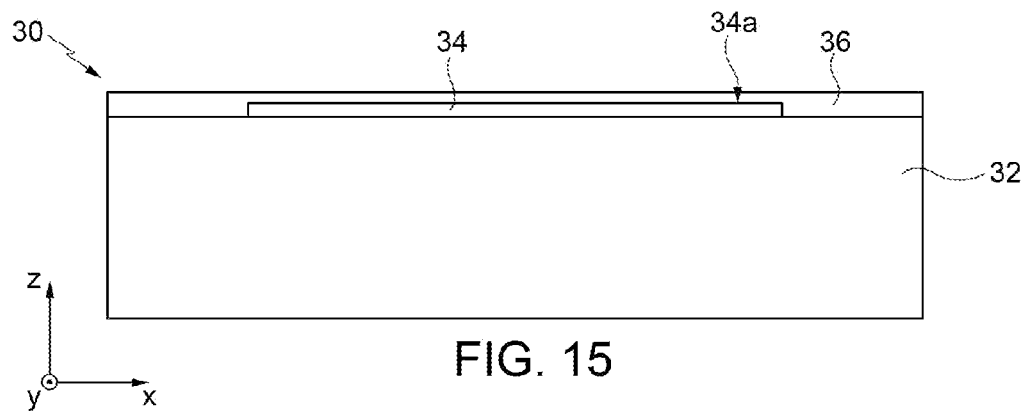

With reference to FIG. 15, a first dielectric (or insulating) layer 36 is deposited over the front side 32a of semiconductor body 32, in particular in such a way to cover the portions of the front side 32a not protected by the sacrificial island 34 and in such a way to extend on the sacrificial island 34. The first dielectric layer 36 is of a material which is not subject to deterioration by the etchant used for removing, in further manufacturing steps, the sacrificial island 34. For example, if the sacrificial island 34 is of polysilicon, the first dielectric layer 36 is of silicon oxide ($SiO_2$).

The first dielectric layer 36 is formed, in particular, by a known deposition technique, e.g., PECVD or LPCVD. The thickness of the first dielectric layer 36 is not uniform over the entire wafer 30, in particular it is thicker (e.g., in the range 1 µm-2 µm) around the sacrificial island 34 and thinner (e.g., in the range 0.5 µm-1.5 µm) on the sacrificial island 34, in such a way that the top surface 34a of the sacrificial island 34 substantially extends parallel to the XY plane. This is achieved by executing a polishing step (e.g., chemical-mechanical-polishing, CMP) after forming the first dielectric layer 36.

Figure 16:
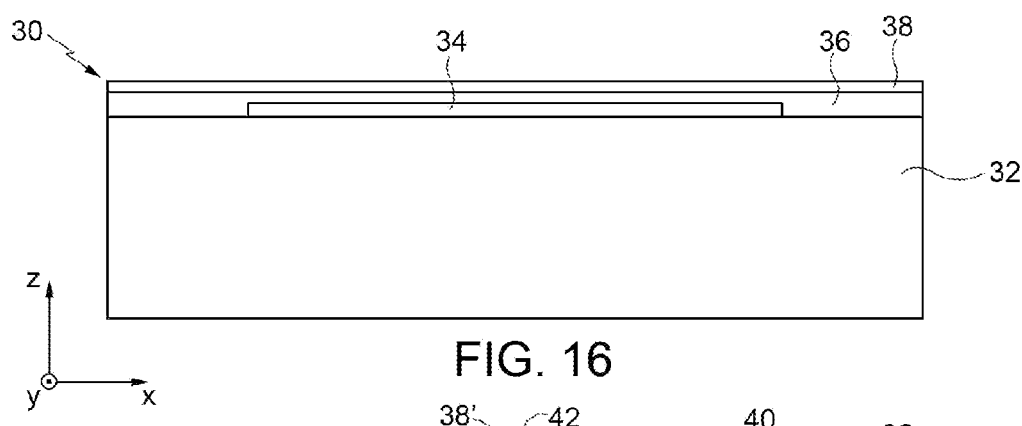

With reference to FIG. 16, a second dielectric (or insulating) layer 38 is deposited on the first dielectric layer 36. The second dielectric layer 38 is of a material which is not subject to deterioration by respective etchants used to remove, in further manufacturing steps, the sacrificial island 34 and the first dielectric layer 36. For example, if the sacrificial island 34 is of polysilicon and the first dielectric layer 36 is of silicon oxide, then the second dielectric layer 38 is of silicon nitride (SiN).

Figure 17A:
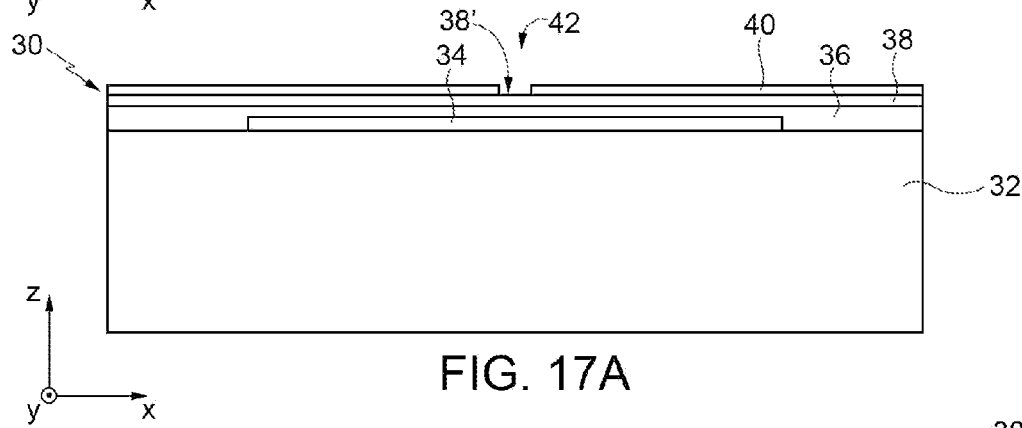

With reference to FIG. 17A, a photoresist layer 40 is formed on the second dielectric layer 38 and patterned in such a way to define a mask covering the second dielectric layer 38 with the exception of a strip-like region 42. The strip-like region 42 is formed in a portion of the photoresist layer 40 substantially aligned, along Z direction, to the sacrificial island 34. In other words, when observing the wafer 30 from the top, the strip-like region 42 is completely contained by the sacrificial island 34.

Figure 17B:
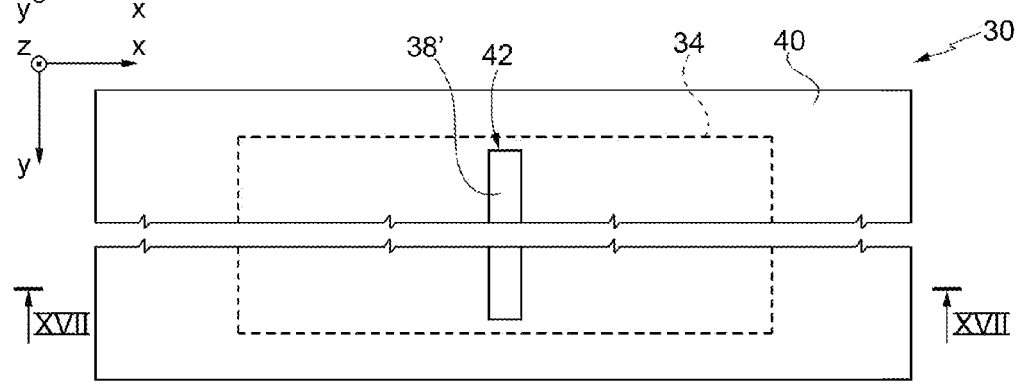

The shape and arrangement of the strip-like region 42 can be better appreciated considering FIG. 17B which is a top view of the wafer 30 of FIG. 17A. The strip-like region 42 is an aperture extending through the entire thickness of the photoresist layer 40, exposing a superficial portion 38' of the second dielectric layer 38. It is apparent that the shape of the region 42 may be different from that shown in FIG. 17B. For example, according to different embodiments, region 42 has a square shape, or generally polygonal shape.

Figure 18:
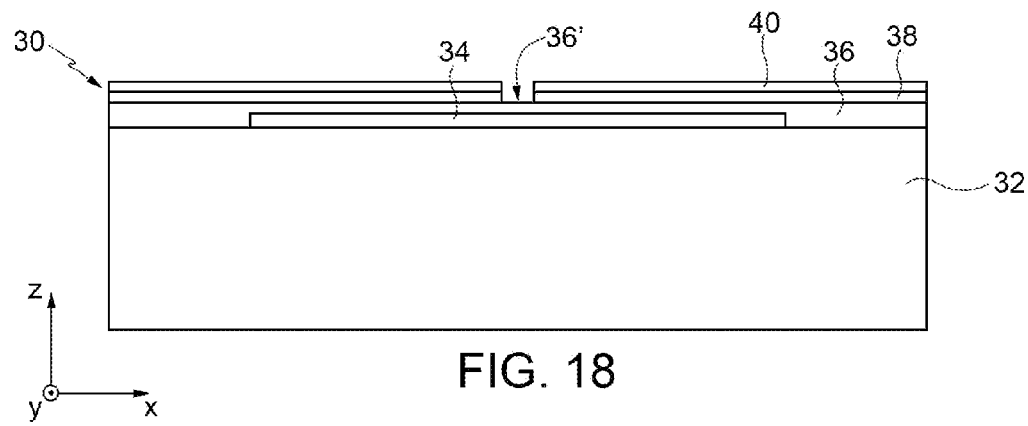

With reference to FIG. 18, the second dielectric layer 38 is selectively removed at the exposed a superficial portion 38', exposing a superficial portion 36' of the first dielectric layer 36. When the second dielectric layer 38 is of silicon nitride, the etching step of FIG. 18 is carried out using selective dry plasma etching. Since the used etchant selectively removes SiN but not $SiO_2$, the underlying first dielectric layer 36 is not removed and operates as an etch-stop layer.

Figure 19:
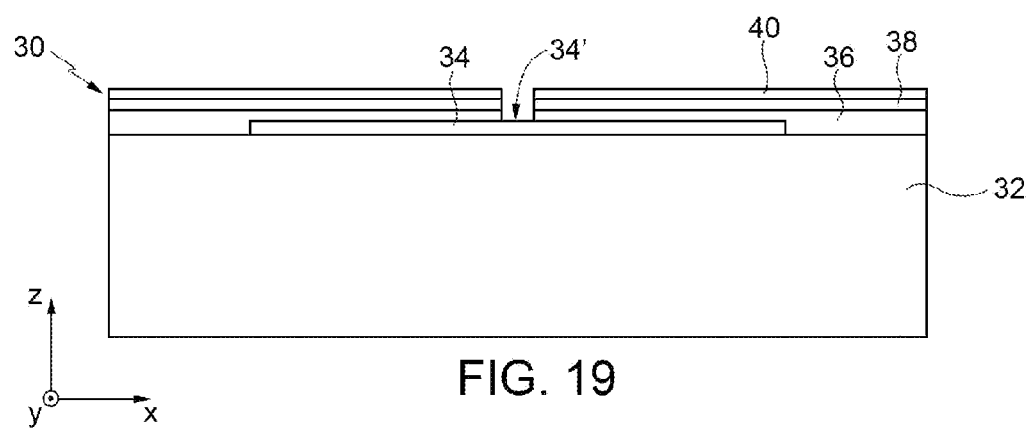

With reference to FIG. 19, a further etching step is carried out to selectively remove the first dielectric layer 36 at the superficial portion 36'. The etching step of FIG. 19 is carried out using selective dry plasma etching, which selectively remove the $SiO_2$ but not the polysilicon; accordingly, the sacrificial island 34 underlying is not removed and operates as an etch stop layer for the considered etching step. At the end of the step of FIG. 19, a superficial portion 34' of the sacrificial island 34 is exposed through the photoresist layer 40, the first dielectric layer 36 and the second dielectric layer 38.

Figure 20:
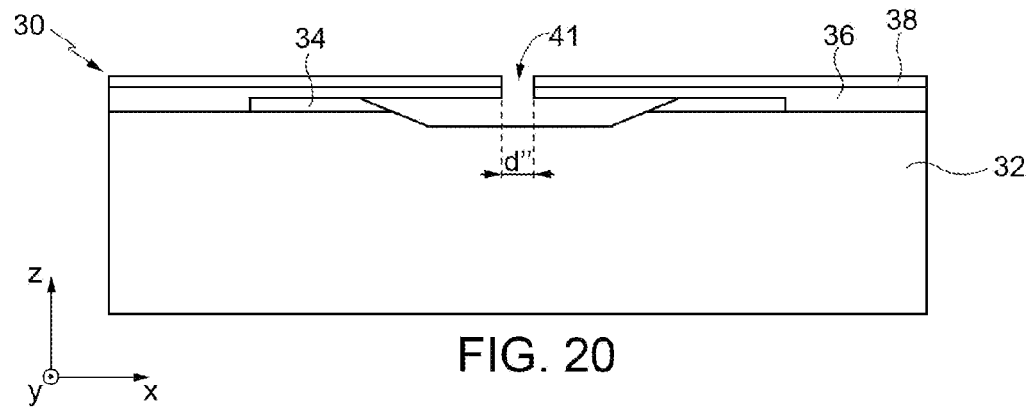

With reference to FIG. 20, the photoresist layer 40 is removed and the sacrificial island 34 is attacked (etched) at the superficial portion 34'. This etching step is carried out in a chemical bath of TMAH, and allows removal of the exposed portion of the sacrificial island and also of portions of the sacrificial island 34 extending below the first dielectric layer 36. The etching of polysilicon of the sacrificial island 34 is isotropic, and the same chemical bath removes portions of the semiconductor substrate 2 (made of silicon in the considered embodiment) extending below the sacrificial island 34, at the removed portion of the latter. The silicon etching is of anisotropic type, and proceeds along crystallographic planes <100>. A passing hole, or aperture, 41 through the first and the second dielectric layer 36, 38 is formed. Aperture 41 has a dimension d", along X direction, from about 10 µm to about 100 µm, for example equal to 50 µm.

Figure 21:
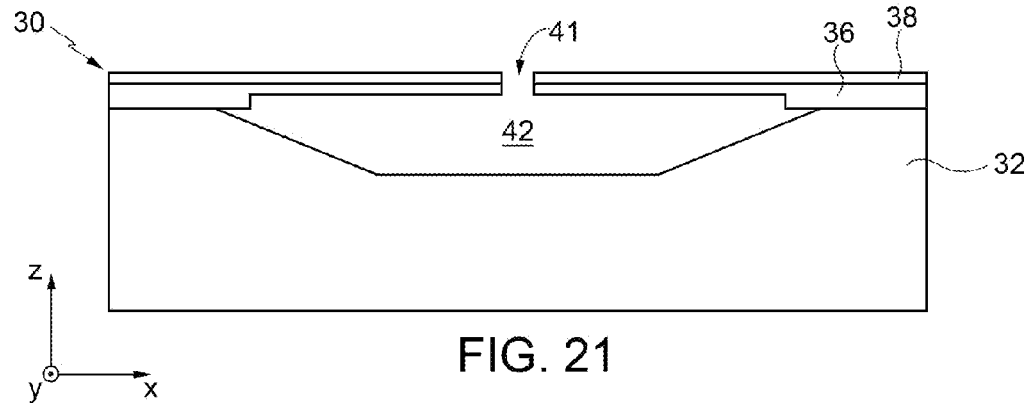
Figure 22:
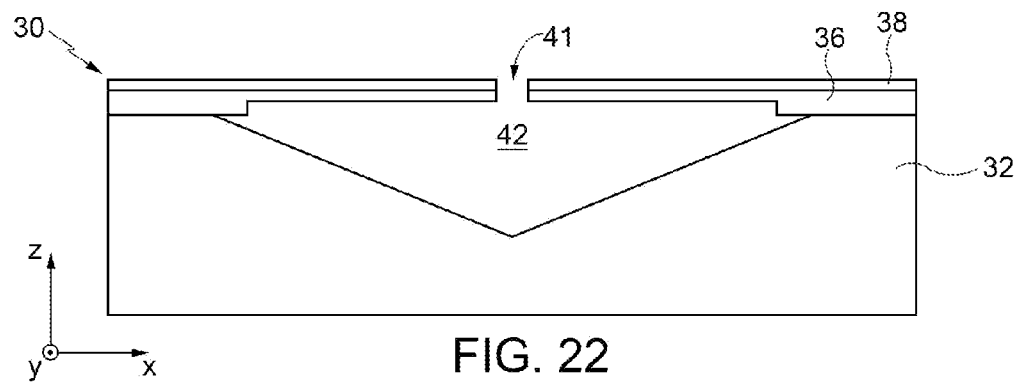

With reference to FIGS. 21 and 22, the etching process for forming the channel continues. After attacking the polysilicon sacrificial layer by the TMAH isotropically, the etchant spreads along this layer and once the layer is consumed, the TMAH starts attacking the Silicon substrate. The etching continues until a desired form for the channel is reached (here, triangular cross section; however, a trapezoidal cross section may be obtained). The etching may be carried out using TMAH 6%, at temperature of about 60° C., with a flow rate of etchant of about 10 l/min, for a time of about 3 h and 30 min.

A channel 42 is thus formed.

Figure 23:
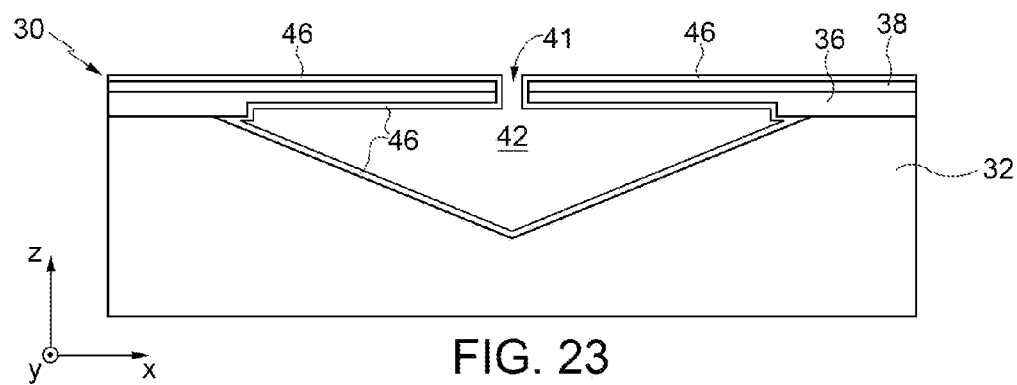

With reference to FIG. 23, the wafer 30 is placed in a deposition chamber (not shown), and a polysilicon deposition step is carried out, forming a covering layer 46. The polysilicon is deposited by means of LPCVD or PECVD, and covers the inner walls of the channel 42, through the aperture 41. The polysilicon is also deposited on the wafer 30 covering the second dielectric layer 38, at the aperture 41 (narrowing, but not obstructing, the aperture 41), and on the first dielectric layer 36 on its superficial portions facing the channel 42. The covering layer 46 is, in particular, formed by arranging the wafer 30 in a deposition chamber, at a temperature of about 620° C., introducing in the chamber $SiH_4/N_2$ gas, at a pressure of about 210 mTorr, for a time of about 40 min.

The covering layer 46 has a thickness from 450 nm to 1000 nm, in particular equal to 450 nm.

According to different embodiments, the covering layer 46 may be of a material other than polysilicon, for example silicon nitride (SiN) or silicon oxide ($SiO_2$).

Figure 24:
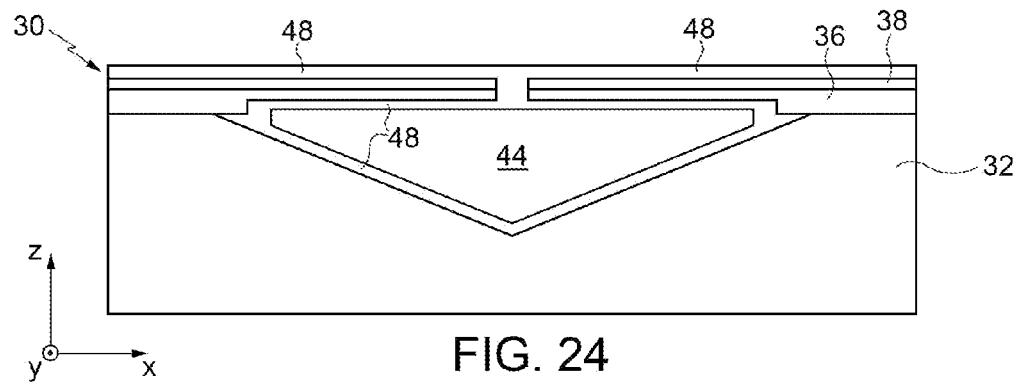

With reference to FIG. 24, a thermal oxidation step is carried out, to oxidize the covering layer 46 and to grow an oxide layer 48 which uniformly covers the inner walls of the channel 42, and completely fills the aperture 41. A buried channel 44 is thus formed. In the embodiment disclosed, where the covering layer 46 is of polysilicon, the oxide layer 48 is a polysilicon oxide layer grown using a thermal process. In particular, the wafer 30 is set in a growth chamber at a temperature of about 900° C., introducing gas $N_2$, or $O_2$, or $O_2/H_2$, or DCE for a time of about 35 min.

It is noted that, given the relatively low thickness of the covering layer 46, the thermal oxidation step to form oxide layer 48 is self-controlled in the sense that, when substantially all the polysilicon material of the covering layer 46 has reacted with the oxygen-based gas supplied to the growth chamber, the oxide growth naturally comes to an end. Alternatively, the oxide-growing step may be monitored and stopped when the channel 42 is completely covered, thus obtaining the buried channel 44.

The oxide layer 48 is also formed in other regions of the wafer 30, in particular, where the previously formed covering layer 46 is present. In particular, since the superficial portions of the first dielectric layer 36 facing the inside of the channel 42, 44 were covered by a polysilicon layer, the oxidation step of FIG. 24 has the consequence that the superficial portions of the first dielectric layer 36 facing the inside of the channel 42, 44 become covered by a polysilicon oxide layer. In other words, the buried channel 44 has all walls covered by a polysilicon oxide layer 48.

The oxide layer 48 may be formed using a different technique, for example a deposition technique, depositing silicon oxide (SiO2). Alternatively, another material, different from an oxide, may be used, for example silicon nitride (SiN). Accordingly, independently from the material used, the layer 48 is more generally a structural layer 48 which has the function of filling the aperture 41 in such a way to completely cover the channel 42 and to form the buried channel 44. The structural layer 48, moreover, covers the internal walls of the channel 44. The material of the structural layer 48 may be chosen according to the type of fluid which, during use, is supplied to the buried channel 44. In particular, specifications such as biological compatibility may be taken into account. Silicon oxide and polysilicon oxide guarantee biological compatibility.

Figure 25:
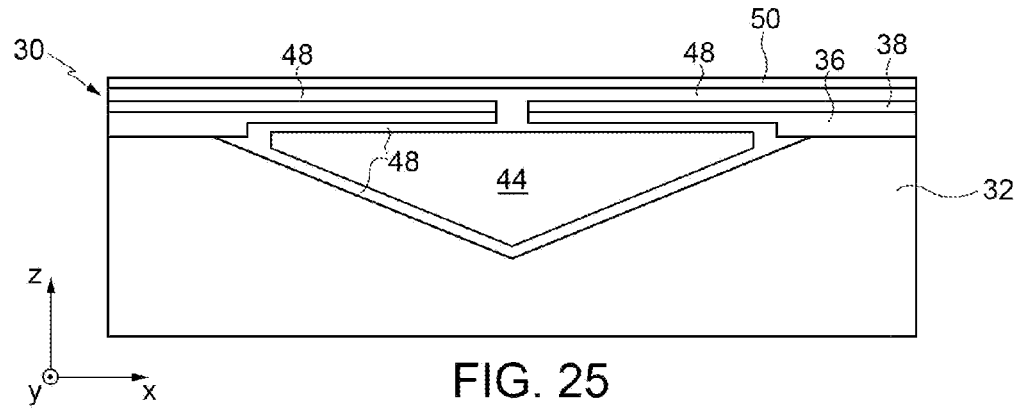

With reference to FIG. 25, a third dielectric (or insulating) layer 50 is formed on the wafer 30, above the structural layer 48. The third dielectric layer 50 is, for example, of silicon nitride (SiN), formed by deposition technique, and having a thickness in the range 1 µm-2 µm, for example equal to 1 µm.

Figure 26:
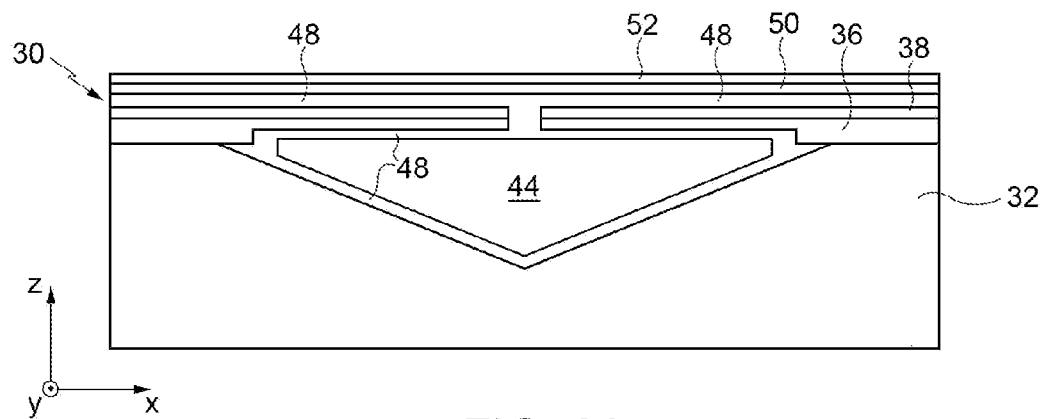

With reference to FIG. 26, a fourth dielectric (or insulating) layer 52 is formed on the wafer 30, above the third dielectric layer 50. The fourth dielectric layer 52 is, for example, of silicon oxide ($SiO_2$), formed by deposition technique, and having a thickness in the range 1 µm-2 µm, for example equal to 1 µm.

According to an aspect of the present disclosure, after completing the manufacturing steps of FIG. 10, or, analogously, the manufacturing steps of FIG. 26, further steps are carried out to form thermoelements (in particular, thermocouples or thermopiles) integrated in the respective wafers 1 and 30.

The manufacturing steps for forming thermopiles are shown in FIGS. 27-37. By way of an example, the process steps of FIGS. 27-37 are illustrated based on wafer 1 of FIG. 10 (where the buried channel 14 has a rectangular form in cross section view). However, the process steps of FIGS. 27-37 can be applied to wafers housing a buried channel having any shape, in particular a triangular-shaped channel as shown in FIG. 11 or a trapezoidal-shaped channel as shown in FIG. 12.

According to further embodiments, not shown, the buried channel 14 may have other shapes, such as oval or circular.

Moreover, process steps of FIGS. 27-37 can be analogously carried out on wafer 30, after the manufacturing steps of FIG. 26.

In the following, further manufacturing steps are executed on dielectric layers 20 and 22 of FIG. 10. When considering wafer 30 of FIG. 26 as starting wafer, the same steps are executed on dielectric layers 50 and 52 which correspond, respectively, to dielectric layers 20 and 22.

Figure 27:
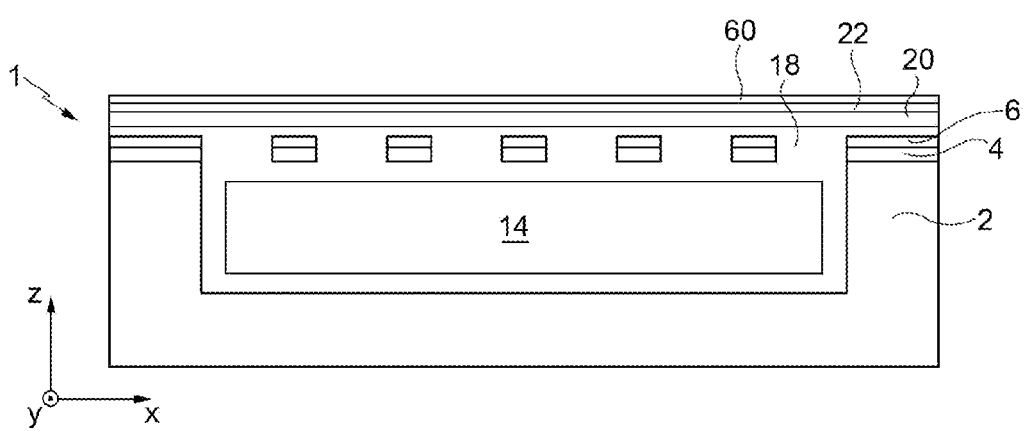
FIGS. 27-37 show, in a cross section view, manufacturing steps for manufacturing integrated thermocouples in the electronic device of FIG. 10, according to an embodiment of the present disclosure.

With reference to FIG. 27, a first thermo-element layer 60 is deposited on wafer 1, on the fourth dielectric layer 22. The first thermo-element layer 60 is of an electrically conductive material, for example, a metal such as aluminum, or doped polysilicon. By way of example, in the following description it is supposed that the first thermo-element layer 60 is of N+ doped polysilicon, with doping concentration in the range $1.5 \cdot 10^{15}$-$6 \cdot 10^{16}$. The first thermo-element layer 60 has a thickness, in the Z direction, ranging from 0.1 µm to 1 µm, e.g., equal to about 0.5 µm.

Figure 28:
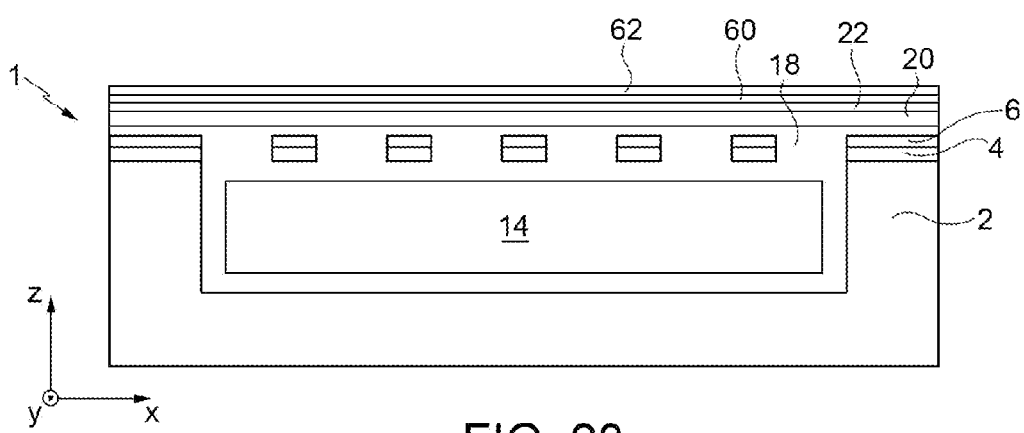

With reference to FIG. 28, a photoresist layer 62 is formed over the first thermo-element layer 60, and subsequently defined, FIG. 29A, by photolithographic technique, forming a mask 64. The mask 64 exposes portions of the first thermo-element layer 60 which, in subsequent manufacturing steps, are to be removed. On the contrary, regions of the first thermo-element layer 60 protected by the mask 64 will not be removed.

Figure 29A:
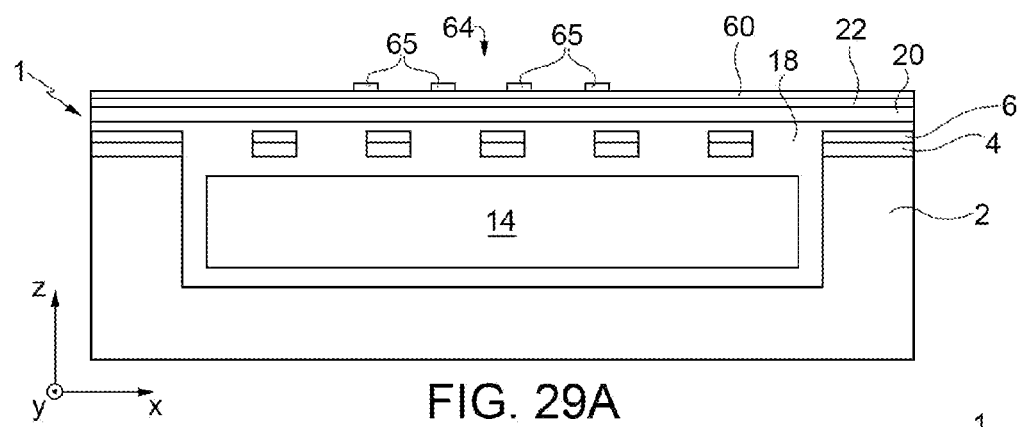
Figure 29B:
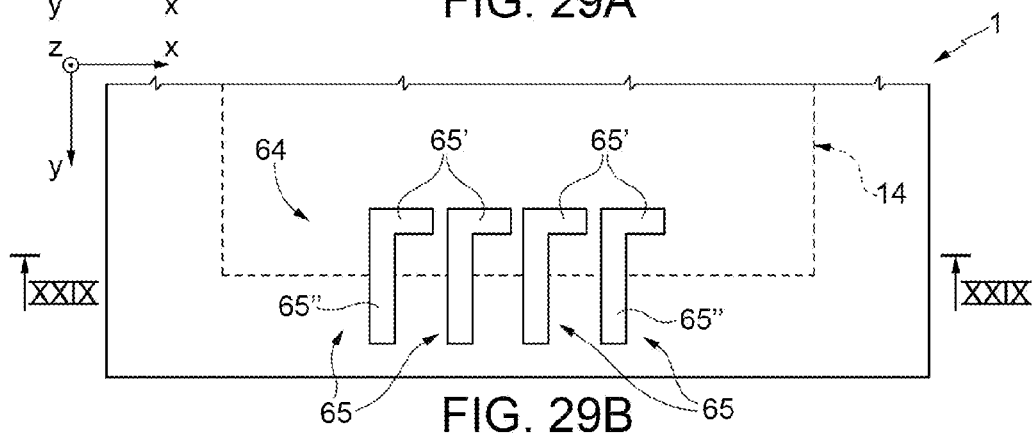

FIG. 29B is a top view of the wafer 1 of FIG. 29A, from which the shape of the mask 64 can be appreciated. FIG. 29A is a cross section view taken along the cut-line XXIX-XXIX of FIG. 29B. According to the embodiment of FIGS. 29A, 29B, the photoresist layer 62 is defined in such a way to form a plurality of L-shaped elements 65 at least partially arranged over, and aligned in the Z direction with, the buried channel 14.

Each L-shaped element 65 has a leg 65' extending over a portion of the buried channel 14, and another leg 65", electrically coupled to the leg 65', staggered with respect to the buried channel 14. Leg 65' is the shorter leg of the "L", while leg 65" is the longer leg of the "L". Accordingly, a portion (the leg 65') of each L-shaped element 65 completely extends over, when considered along Z direction, the buried channel 14, and another portion (the leg 65") of each L-shaped element 65 does not completely extends over the buried channel 14.

The L-shaped elements 65 may have dimensions chosen according to the specifications, and limited by the photolithographic technique used. For example, for each element 65, the shorter leg 65' has a length of about 25 µm, while the longer leg 65" has a length of about 200 µm.

As it will be appreciated later on, the elements 65 forming the mask 64 may have a shape different from "L". For example, they may be straight elements having the form of a "I", or other polygonal shapes. In any case, irrespective of the shape of each element 65, a portion of each element 65 extends over the buried channel 14 (i.e., that portion is aligned, along Z direction, with a respective portion of the channel 14), and another portion of the element 65 does not extend over the buried channel 14 (i.e., that portion is not aligned, along Z direction, with a respective portion of the channel 14).

Figure 30A:
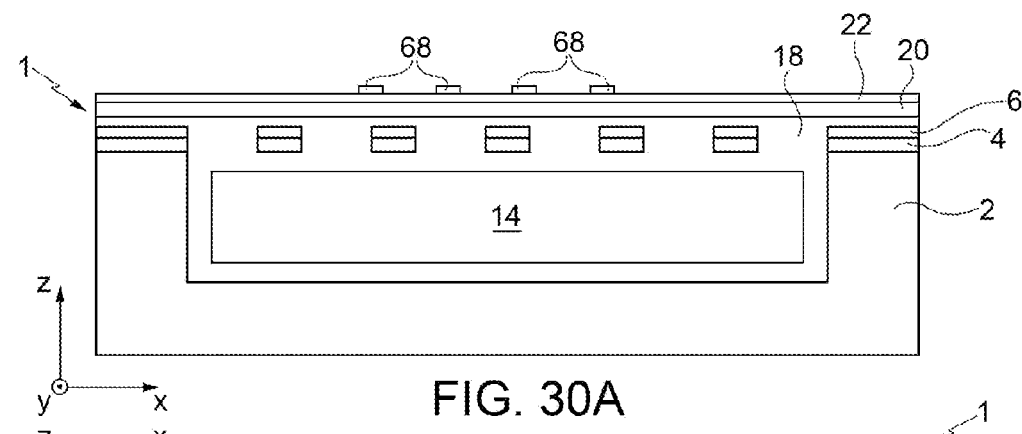
Figure 30B:
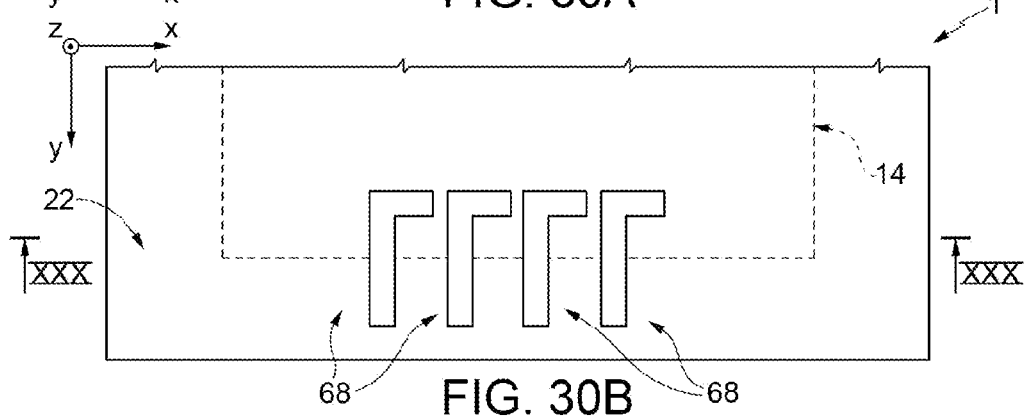

With reference to FIGS. 30A, 30B, the first thermo-element layer 60 is selectively removed using, e.g., polysilicon dry plasma etch. The etching of the first thermo-element layer 60 allows removal of the first thermo-element layer 60 where it is not protected by the mask 64, exposing respective superficial portions of the underlying fourth dielectric layer 22. Then, the mask 64 is removed. As shown in FIGS. 30A and 30B, the etching of the first thermo-element layer 60 generates a plurality of first thermo-elements 68 having, in top view, shape and arrangement which are analogous to those described with reference to the L-shaped elements 65 of the mask 64.

Figure 31:
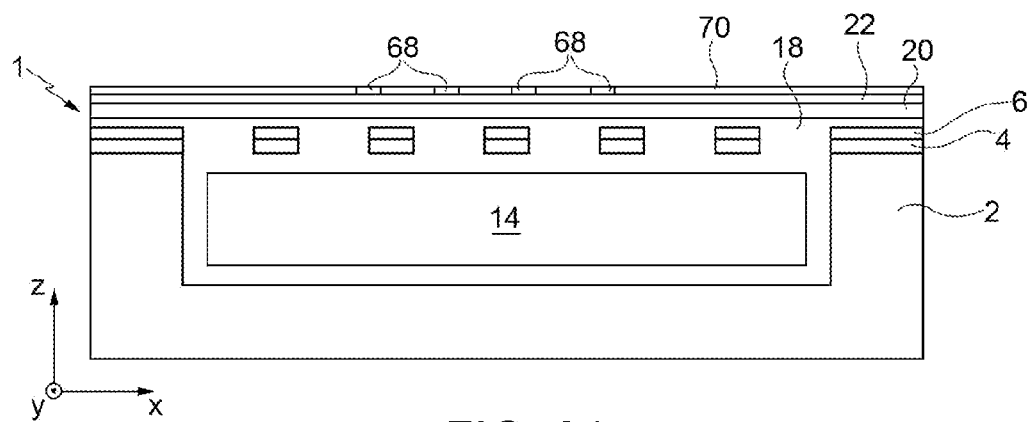

With reference to FIG. 31, a first electrical-isolation layer 70, for example of dielectric or insulating material, in particular of silicon nitride (SiN), is deposited over the wafer 1, in particular on the exposed portions of the fourth dielectric layer 22 (between the first thermo-elements 68), thus electrically isolating each first thermo-element 68 from the other first thermo-elements 68. The first electrical-isolation layer 70 is formed, e.g., by deposition technique. After this deposition step, a subsequent step of polishing (e.g., CMP) may be carried out to remove portions of the first electrical-isolation layer 70 extending above the first thermo-elements 68.

Figure 32:
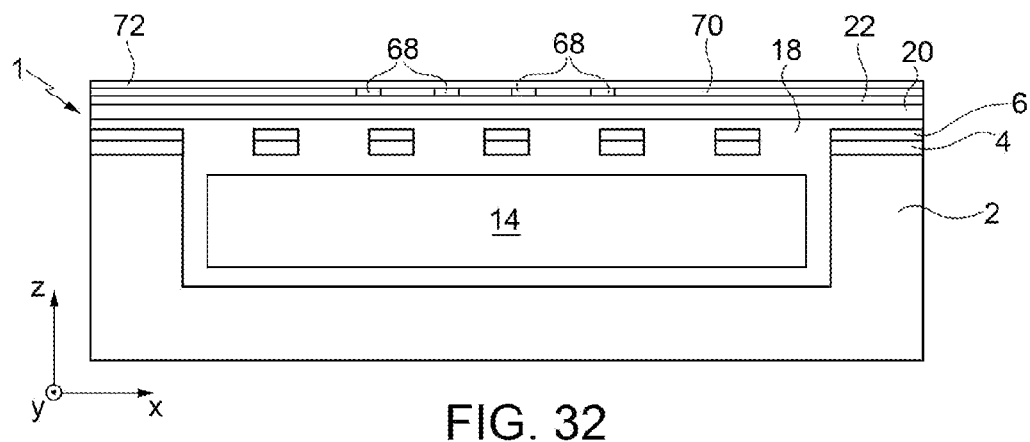

With reference to FIG. 32, a second electrical-isolation layer 72 is formed, e.g., by deposition technique, on the first thermo-elements 68 and the first electrical-isolation layer 70. The second electrical-isolation layer 72 is of a material that can be etched selectively with respect to the material of the first electrical-isolation layer 70. In particular, the second electrical-isolation layer 72 is a dielectric or insulating material, even more particularly of silicon oxide ($SiO_2$).

Figure 33:
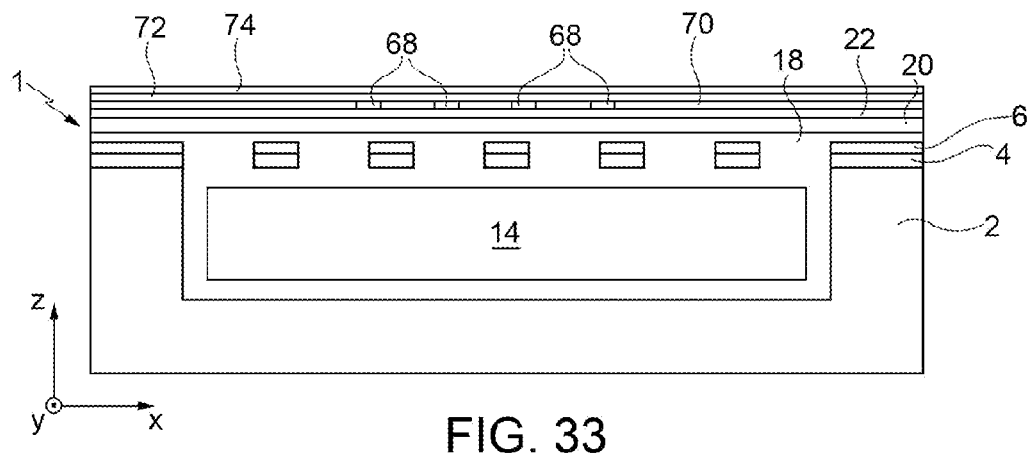

With reference to FIG. 33, a third electrical-isolation layer 74, of a material that can be etched selectively with respect to the second electrical-isolation layer 72, is deposited on the second electrical-isolation layer 72. In particular, the third electrical-isolation layer 74 is a dielectric or insulating material, e.g., silicon nitride (SiN).

Figure 34A:
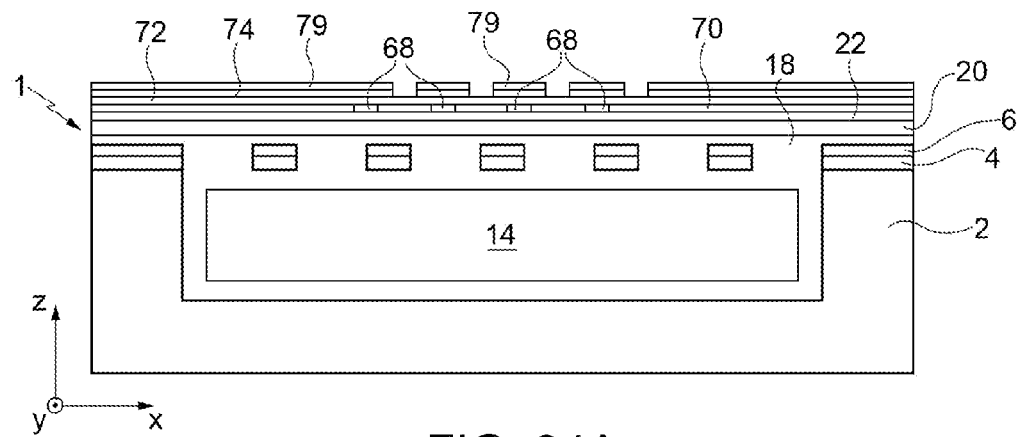

With reference to FIG. 34A, a photoresist layer is formed on the third electrical-isolation layer 74 and photolithographically defined in such a way to form a mask 79 which exposes superficial portions 74' of the third electrical-isolation layer 74. The superficial portions 74' of the third electrical-isolation layer 74 correspond to portions of the wafer 1 where further thermo-elements will be formed, as described in detail in the following.

In particular, the superficial portions 74' have, in a top view, a "L" shape analogous to the shape described for the first thermo-elements 68 and are formed in such a way that each exposed superficial portion 74' is arranged between two adjacent first thermo-elements 68. Moreover, each exposed superficial portion 74' has a region which overlaps a respective region of a first thermo-element 68 and another region which overlaps a respective region of another first thermo-element 68, wherein the two considered first thermo-elements 68 are adjacent to one another.

During an etching step, the third electrical-isolation layer 74 is selectively removed at the superficial portion 74', exposing the second electrical-isolation layer 72 beneath.

During a further etching step, the second electrical-isolation layer 72 is selectively etched at the overlapping regions with the first thermo-elements 68 underlying, so as to form apertures 80 which expose the first thermo-elements 68.

Figure 34B:
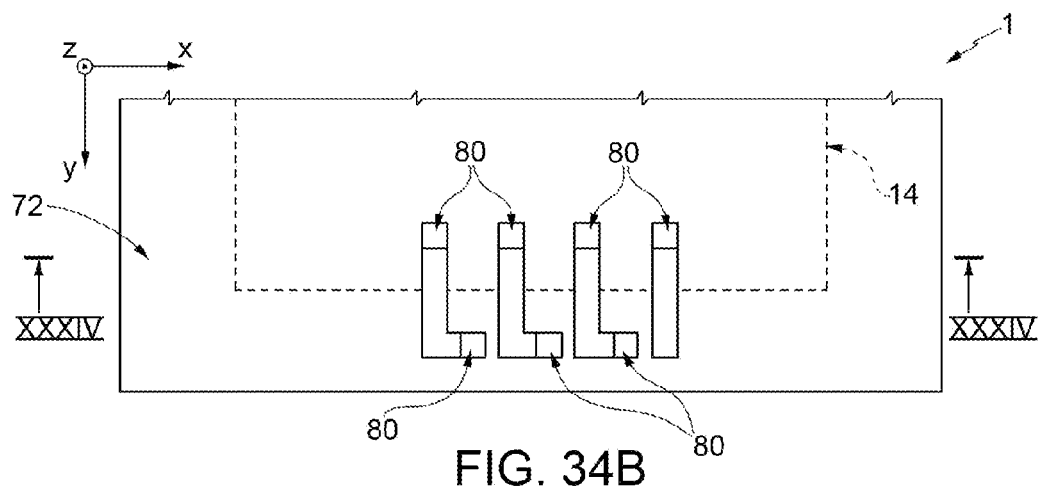

FIG. 34B shows, in a top view, the wafer 1 after the manufacturing steps described with reference to FIG. 34A.

Figure 35:
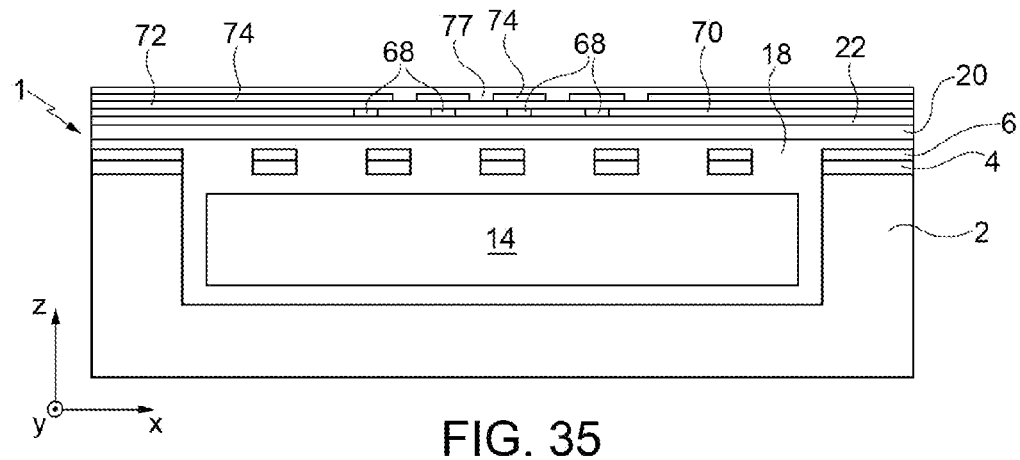

With reference to FIG. 35, a second thermo-element layer 77 is formed on the wafer 1, e.g., by deposition technique. The second thermo-element layer 77 is of a electrically conductive material, for example metal or doped polysilicon. Preferably, second thermo-element layer 77 is of a material which is different from the material of the first thermo-element layer 60. In this example, the second thermo-element layer 77 is of aluminum (Al). The step of forming the second thermo-element layer 77 includes electrically contacting the first thermo-elements 68 through the apertures 80, by respective conductive plugs 81 extending through the apertures 80. The conductive plugs 81 are formed during the same deposition step for forming the second thermo-element layer 77, by depositing the conductive material in the apertures 80, electrically contacting the superficial portions of the first thermo-elements 68 exposed through the apertures 80.

Moreover, the step of forming the second thermo-element layer 77 includes depositing the aluminum on the second electrical-isolation layer 72 where it is exposed.

A subsequent step of polishing (e.g., CMP) allows the removal of the second thermo-element layer 77 above the third electrical-isolation layer 74, and not where the second thermo-element layer 77 is in direct contact with the second electrical-isolation layer 72.

Figure 36A:
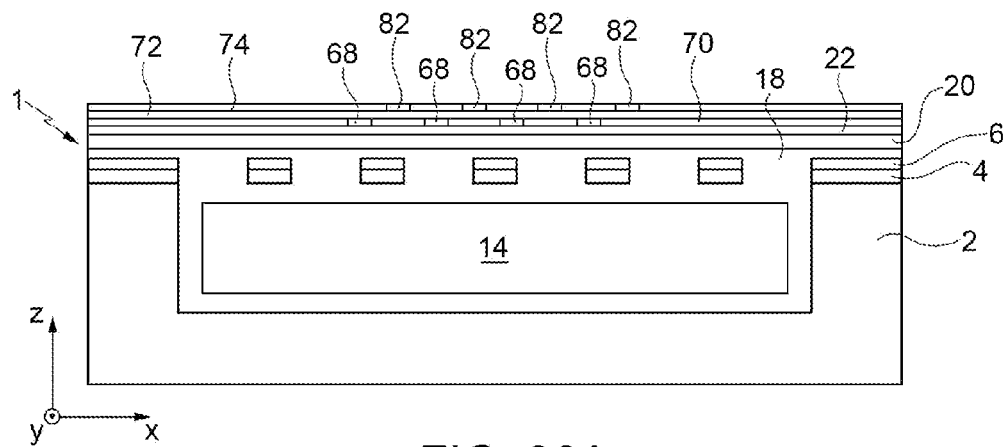
Figure 36B:
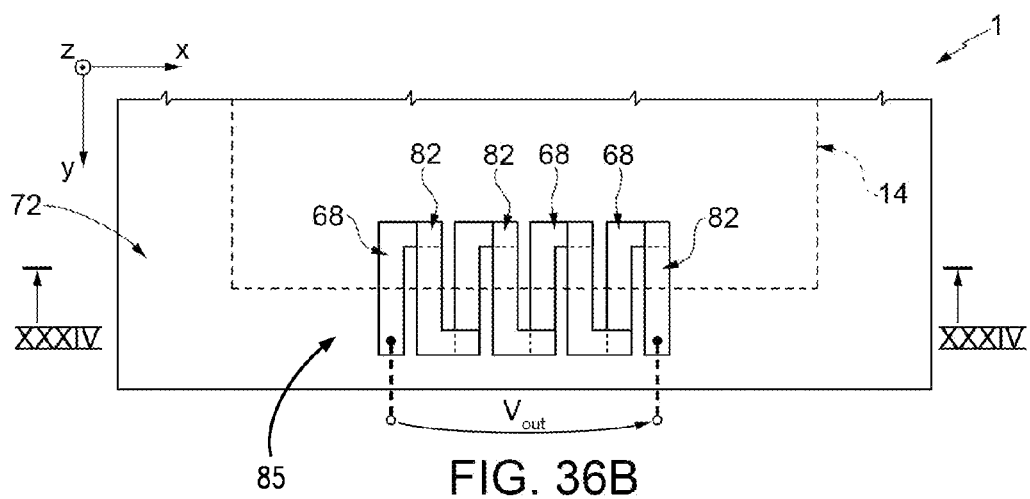

Second thermo-elements 82 are thus formed (FIGS. 36A and 36B). As it can be appreciated from FIG. 36B, which is a top view of FIG. 36A, the second thermo-elements 82 form, together with the first thermo-elements 68, a serpentine-like path. All of the first thermo-elements 68 lie on a same first plane, while all of the second thermo-elements 82 lie on a same second plane. The first plane and the second plane are at different heights when measured along Z direction, parallel to one another and parallel to the plane XY. The first thermo-elements 68 are electrically coupled to the second thermo-elements 82 through the portions of the second thermo-elements 82 extending within the aforementioned apertures 80.

A plurality of thermocouples (each thermocouple including one first thermo-element 68 and one second thermo-element 82 electrically coupled together as described) are thus formed and, accordingly, it is also formed a thermopile 85 which includes a plurality of thermocouples connected in series to one another.

End portions $E_1$, $E_2$ of the thermopile 85 forms electrical terminals across which a voltage difference or voltage drop $V_{OUT}$ is present. The voltage $V_{OUT}$ varies with varying temperature of the thermocouples junctions, as it is per se known.

Figure 37:
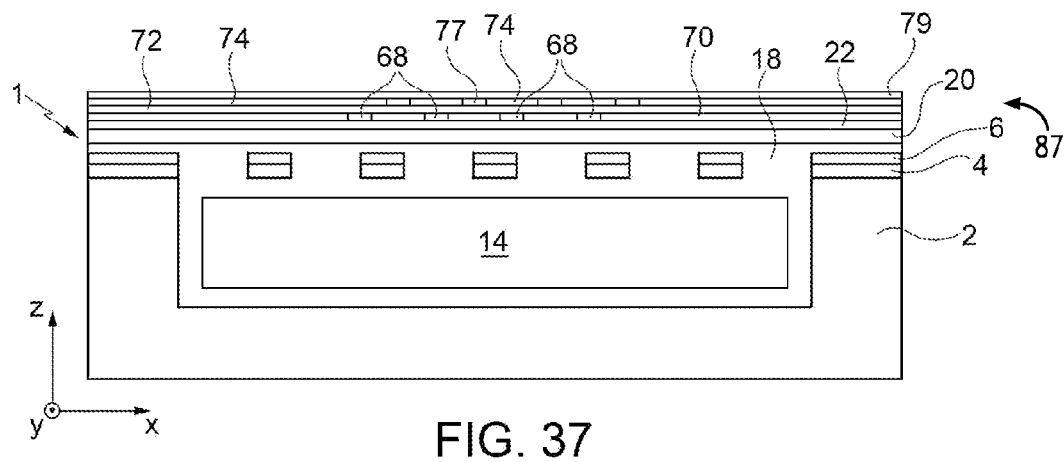

The manufacturing process according to the embodiment disclosed is completed, FIG. 37, with a passivation step, forming a protecting layer 79 on the wafer 1, above the second thermo-elements 82. The protecting layer 79 is, e.g., of dielectric or insulating material such as silicon oxide deposited in a per se known way.

It is noted that the plurality of first thermo-elements 68 and the plurality of second thermo-elements 82 (connected together forming a single thermopile) are at least partially suspended over the buried channel 14. Moreover, the first thermo-elements 68 and the second thermo-elements 82 are buried within a structural layer 87 which substantially forms a suspended membrane over the buried channel 14. Such a structural layer 87 comprises, in particular, the portion of dielectric layer 18 suspended over the buried channel 14 and the dielectric or insulating layers 20, 22, 70, 72, 74, 79, according to the embodiment of FIG. 37. When the steps of forming the first thermo-elements 68 and the second thermo-elements 82 are carried out on the wafer processed according to the steps of FIGS. 13-26, the structural layer 87 comprises, in particular, the portion of dielectric layer 48 suspended over the buried channel 44 and the dielectric or insulating layers 36, 38, 50, 52, 70, 72, 74, 79.

Figure 40:
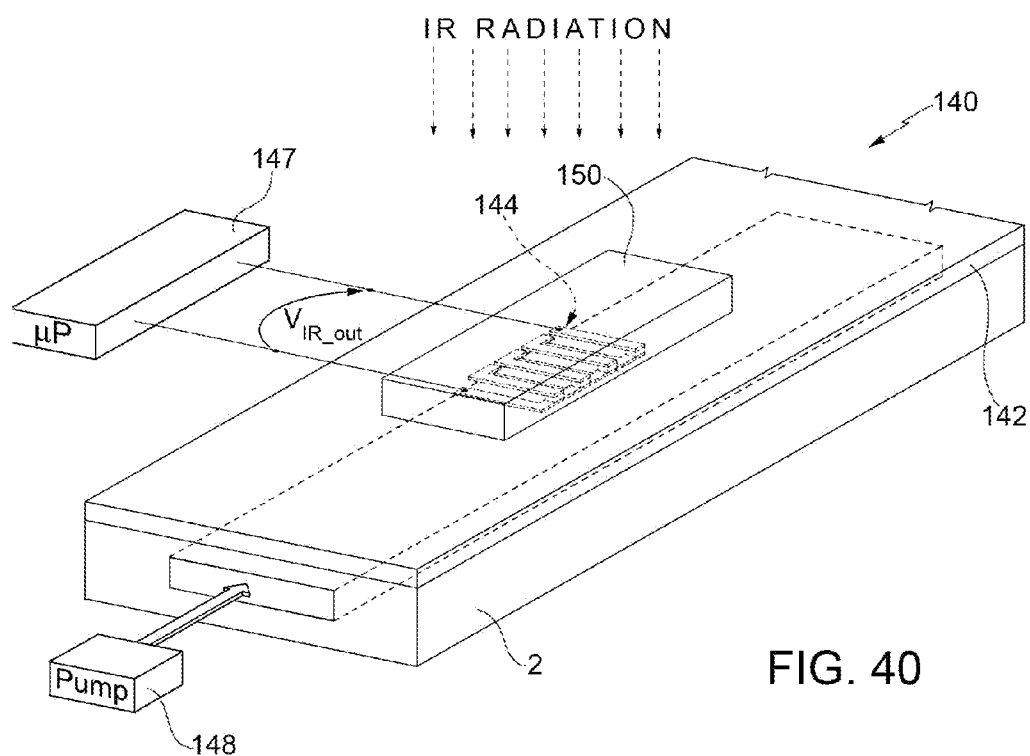
FIG. 40 shows an infra-red detection device including the electronic device manufactured according to the present disclosure.

The disclosed manufacturing method (according to any one of the described embodiments) is applicable to the manufacturing of flow-meter sensors (see FIGS. 38, 39) and/or to the manufacturing of an InfraRed (IR) sensors (see FIG. 40).

Figure 38:
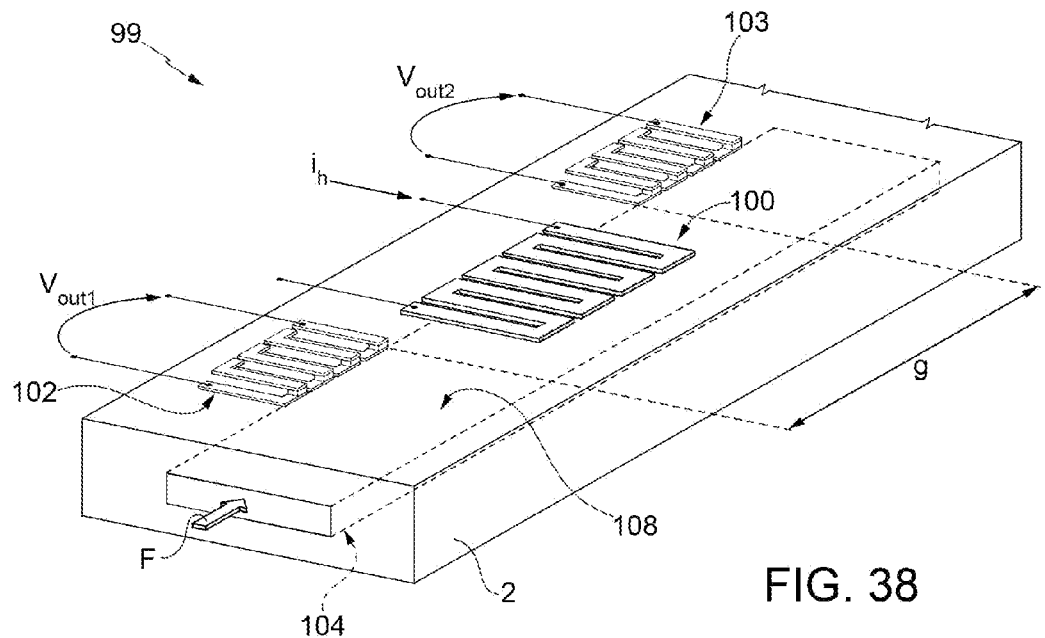
FIG. 38 shows an embodiment of a flow meter based on the electronic device of FIG. 1 with integrated thermopiles, manufactured according to an embodiment of the present disclosure.

A thermal flow sensor (or flow-meter) 99, according to an embodiment of the present disclosure, is schematically shown in FIG. 38 and comprises a heater 100 arranged between a first temperature sensor 102 and a second temperature sensor 103, above a buried channel 104 (which can be any one of the channels 14, 28, 44 previously described according to the respective embodiments). The first temperature sensor 102 is arranged at a first location above the buried channel 104, and the second temperature sensor 103 is arranged at a second location above the buried channel 104, at a certain distance g from one another, e.g., of the order of 400 µm (which is anyway dependent on the power generating capacity of the heater).

The temperature sensors 102 and 103 are thermopiles, manufactured as disclosed, in particular, with reference to FIGS. 27-37. The buried channel 104 of the thermal flow sensor 99 is manufactured as disclosed with reference to FIG. 1-12 or 13-26, according to the respective embodiments. Accordingly, structural elements already described with reference to FIGS. 1-37 are no more described, and are indicated with the same reference numbers previously used.

The heater 100, which is substantially a strip (or serpentine) of a material which shows Joule effect when a current is made to flow through its ends, is integrated in the thermal flow sensor 99 above the channel 104, and is arranged between the first temperature sensor 102 and the second temperature sensor 103, for example buried within the third dielectric layer 20, or the fourth dielectric layer 22, or within the above electrical-isolation layers 70, 72 or 74 (not shown in FIG. 38).

The oxide layer 18 forms a membrane 108 suspended over the channel 104, such that the first temperature sensor 102, the second temperature sensor 103 and the heater 100 are arranged at least partially over the membrane 108.

To measure the flow of a fluid which flows within the buried channel 104, it is supposed that the first temperature sensor 102 is arranged upstream and the second temperature sensor 103 is, consequently, arranged downstream. The "upstream" and "downstream" locations are, of course, defined with reference to the fluid flow direction (indicated by arrow F in FIG. 38). The heater 100 is heated by an electric current $i_H$, exploiting Joule effect.

As a principle, the mass flow in the buried channel 104 is detected by a shift in the thermal balance of the first and second temperature sensors 102, 103.

The metering, or measuring, method is schematically explained in the following; however, it is generally known in the art. Here, the fluid flows through the buried channel 104. The first temperature sensor 102 is at a temperature Tup while the second temperature sensor 103 is at a temperature Tdown. The heater 100 is powered at a constant power. The resulting temperature profile in the buried channel 104 is asymmetric when the fluid flow is higher than zero (i.e., the fluid is flowing in the channel 104 at a certain velocity). The resulting temperature difference ΔT between Tup and Tdown is a measure for the mass flow, because the thermal shift is substantially related to the number of molecules passing the sensor.

The temperature Theater of the heater 100 is maintained at a certain value above the temperature of the incoming fluid (supposed to be Tup, measured by temperature sensor 102). When no fluid flows, Tup and Tdown are affected similarly by the heat from the heater 100. When there is a fluid flow (for example from Tup to Tdown), Tup falls while Tdown increases. This effect can be associated to a flow rate of the fluid, in a per se known way.

It is noted that relative values of the signal outputted by the two thermopiles 102, 103 are of practical interest, rather than the absolute value. The difference in the voltage outputs ($V_{OUT2}-V_{OUT1}$) of the downstream and upstream thermopiles 103, 102 can easily be associated to the temperatures to which thermopiles 102, 103 are subject and, as a consequence, to the velocity of the flow in the channel 104, from which the flow rate can be calculated in a per se known way.

If, according to another embodiment, not shown, the fluid were to flow on top the thermopiles 102, 103 rather than under, they would face the same situation. To obtain reliable results, the output of the temperature sensors 102, 103 is calibrated using a reference temperature sensor (not shown). For example, an output of value "Vout" from a thermopile may correspond to a temperature of "Tout" ° C. This calibration curve may then be stored in a memory (e.g., EEPROM) and a microcontroller references this curve before furnishing the final output. Furthermore, as the specific heat capacity and thermal capacitance or conductance of a material is constant, the heat dissipated by the dielectric/insulating layers extending between the membrane 108 and the temperature sensors 102, 103 is always a constant and can easily be compensated as an offset to the sensitivity of the device.

The volume flow rate Q is given by Q=V·A, where A is the measure of the channel cross-section (in X direction); and V is the average velocity of the fluid.

Mass flow rate W is given by W=r·Q, where r is the fluid density; and Q is the volume flow rate calculated as shown above.

Figure 39:
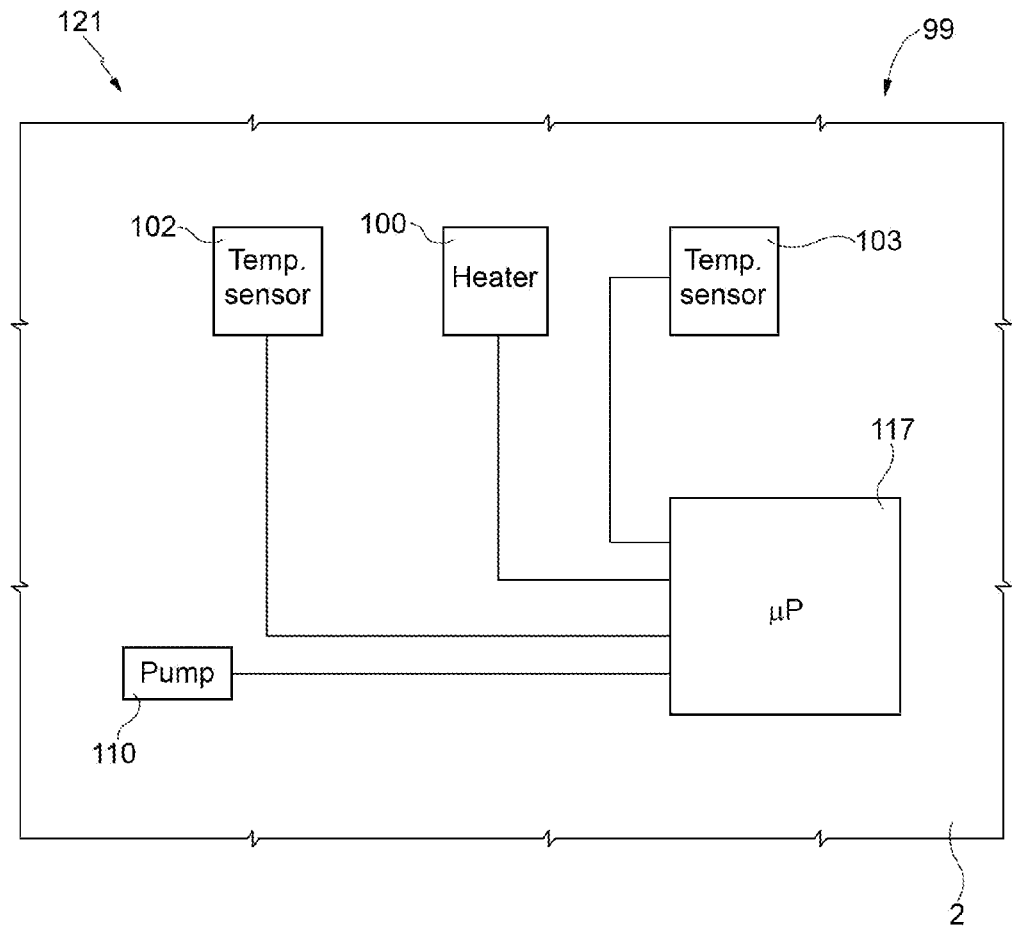
FIG. 39 shows a block representation of a system including the flow meter of FIG. 38.

A simple block diagram of a flow sensor system 121, including the flow sensor 99 and provided with computation circuitry, is shown in FIG. 39. As shown, system 121 comprises a control unit 117, which, e.g., includes analogue circuitry, such as amplifiers, an A/D-converter as well as digital circuitry. It controls heater 100 and measures the (voltage) signals acquired from the temperature sensors 102, 103. It processes the signals from the temperature sensors 102, 103, associating a received voltage value with a corresponding temperature and computes temperature difference ΔT. All or at least part of the electronic components shown in FIG. 39 are integrated in the substrate 2 of the sensor 99; however, part or all of these electronic components may also be implemented as external circuitry.

The flow sensor 99 further includes a micro pump 110, configured to pump the fluid within the buried channel 104, with, e.g., a certain, predetermined, velocity which depends on the particular application. The information obtained by the measure of the mass flow rate can be used by the control unit 117 to control the micro-pump 110 such as to increment or reduce the mass flow rate of the fluid flowing in the buried channel 104. The pump 110 may be controlled by the control unit 117 in such a way to alter other parameters of the fluid, e.g., the quantity of the fluid inputted in the buried channel 14.

According to a further embodiment of the present disclosure, the manufacturing steps previously described with reference to FIGS. 1-37 may be applied to the manufacturing of a thermoelectric IR sensor, such as the IR sensor 140 shown in FIG. 40. When an IR absorber 142 is coupled to a thermocouple (or thermopile) 144, the thermocouple junction will warm up due to the incident IR radiation absorbed by the IR absorber 142.

The IR absorbing layer 142 may be, according to a further embodiment, an IR filter.

The thermocouple/thermopile 144 provides at output a voltage signal $V_{IR\_OUT}$ which is a measure of the temperature at the thermocouple/thermopile 144, due to the heat generated by the incoming IR radiation.

The output a voltage signal $V_{IR\_OUT}$ is acquired, and interpreted, by a control circuit 147. The mere presence of a voltage signal $V_{IR\_OUT}$ higher than a predefined threshold (which is a noise threshold) indicates that an IR radiation is revealed. Moreover, by calibrating the control circuit 147, the acquired value of the voltage signal $V_{IR\_OUT}$ is also indicative of an amount of IR radiation which impinges on the IR absorber 142 and, as a consequence, warms up the thermocouple/thermopile 144.

Moreover, the thermocouple or thermopile 144 is preferably protected from visible and near-infrared light, in order to further increase measurement accuracy. Therefore, a shield blocking visible and near-infrared light may be provided, for preventing that such light reaches the thermocouple or thermopile, but not interfering with the IR radiation to be sensed. In the embodiment of FIG. 40, a shield 150 is arranged on the thermocouple/thermopile 144. In particular if substrate 2 is transparent to IR radiation, a further light absorbing layer (not shown) should also be arranged at the side 2b of substrate 2 for improving coverage of the thermocouple/thermopile 144. Instead of, or in addition to, the IR absorber 142, a light absorbing housing (not shown) can be used as shield.

It is noted that, according to an aspect of the present disclosure, when the device 140 is used as an IR sensor, a buried channel 146 may anyway be provided under the thermocouple/thermopile 144, and a fluid may be pumped through the channel 146 by a controllable (micro)pump 148. In this case, the fluid flowing within the buried channel 146 acts as a coolant for the thermocouple/thermopile 144, thus achieving a cooled IR sensor which does not need external cooling means. The pump 148 may be controlled in such a way to alter the velocity or the quantity of the fluid in the buried channel such as to increase or reduce the cooling effect.

Finally, it is apparent that modifications and variations may be made to the embodiments described and illustrated herein, without thereby departing from the scope of protection of the present disclosure.

In the embodiments shown and described so far, a single buried channel was shown integrated in the substrate. In many applications, the number of buried channels may be higher than one. The length and course of the channels can be adapted to the respective specifications. Also depending on the intended application, several thermocouples/thermopiles can be integrated over a same single channel or over respective channels, such that a flow measurement or cooled IR detection can be carried out at several locations of a single fluidic-based device.

Moreover, it is noted that the "L" shape for the conductive elements forming a thermocouple is one of the numerous configurations in which a thermocouple may be fabricated. Two L-shaped elements form complementary elements of the thermocouple. These L-shaped elements are, in fact, serially connected together to form one large thermopile. This is one of the many possible configurations in which the two elements of the thermocouple, and the thermopile as a whole, may be fabricated and arranged. In some configurations, the two conductive elements of the thermocouple directly overlap each other, and the connection of one element to another is provided by a metal plug that runs perpendicular to the plane of the substrate (buried in insulating layers). In some configurations, the two elements may be placed side-by-side (but always separated by at least an insulating layer of dielectric such as oxide, e.g., $SiO2$). Finally, the L-shape is one among many possible shapes that can be possibly employed in the fabrication of a MEMS thermopile system. The short arm of the "L" is a lead that provides some space for the second "L" found on an upper level, to make contact with. In some examples, the elements of the thermocouple may be straight (as in the case where they are directly overlapped). Also, a serial connection of these thermocouples to form the thermopile lends itself to at least one level of "L".

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
    a semiconductor body having a first side and a second side opposite to the first side in a first direction;
    a buried channel extending within the semiconductor body, the buried channel configured to receive a fluid;
    a structural layer of insulating material on the first side of the semiconductor body, the structural layer covering the buried channel and at least a portion of the first side of the semiconductor body; and
    a first temperature sensing element embedded in the structural layer, the first temperature sensing element at least partially over the first side of the semiconductor body and at least partially over the buried channel at a first location.

2. The electronic device according to claim 1, wherein the first temperature sensing element includes a first thermocouple element.

3. The electronic device according to claim 2, wherein the first thermocouple element includes a first strip of a first electrical conductive material and a second strip of a second electrical conductive material different from the first electrical conductive material, the second strip being electrically coupled to the first strip at said first location.

4. The electronic device according to claim 3, wherein the first strip and the second strip of the first thermocouple element are arranged at different positions in said first direction, the first thermocouple element further comprising a conductive plug in the structural layer, the conductive plug electrically coupling the first strip and the second strip together.

5. The electronic device according to claim 2, further comprising a second thermocouple element at least partially over the buried channel, the first and the second thermocouple elements being electrically coupled together and forming a first thermopile element.

6. The electronic device according to claim 3, wherein the first electrical conductive material of the first strip is doped polysilicon and the second electrical conductive material of the second strip is aluminum.

7. The electronic device according to claim 3, wherein the first and the second strips each have an "L" shape or an "I" shape when considered from a top view.

8. The electronic device according to claim 1, wherein the buried channel has a cross sectional shape that is rectangular, trapezoidal, triangular, oval, or circular.

9. The electronic device according to claim 1, wherein the buried channel is configured to receive the fluid through an inlet and a diameter of the buried channel is configured such that, when the fluid flows through the buried channel, the fluid flow has a Reynolds number associated with laminar flow.

10. The electronic device according to claim 9, wherein said Reynolds number is lower than 500.

11. The electronic device according to claim 1, wherein the buried channel has internal walls covered by a silicon oxide layer.

12. The electronic device according to claim 4, wherein the structural layer comprises:
one or more dielectric layers between the first strip and the second strip; and
wherein the first strip and the second strip have respective portions that overlap one another in the first direction, the conductive plug extending through the one or more dielectric layers and aligned in the first direction with said respective portions of the first and second strip that overlap one another.

13. The electronic device according to claim 3, wherein the electronic device is configured to determine a flow rate, the electronic device further comprising:
a second temperature sensing element located in the structural layer and partially over the buried channel at a second location that is different from the first location;
a heater arranged in said structural layer at a third location between the first location and the second location; and
a control circuit coupled to the first and the second temperature sensing elements and configured to acquire a first and a second sensing signal generated by the first and the second temperature sensing elements, respectively, and compute, based on the first and second sensing signals, a flow rate of the fluid flowing between the first location and the second location.

14. The electronic device according to claim 13, wherein the second temperature sensing element is a second thermocouple element that includes a third strip of the first electrical conductive material and a fourth strip of the second electrical conductive material electrically coupled to the third strip at said second location, the second thermocouple element being located in the structural layer and partially over the buried channel at said second location,
wherein the control circuit is coupled to end portions of the first and second strip to sense a first voltage difference across the first and second strips and coupled to end portions of the third and fourth strip to sense a second voltage difference across the third and fourth strips, and
wherein the control circuit is further configured to:
associate said first voltage difference to a first temperature value of the fluid flowing within said buried channel at the first location,
associate said second voltage difference to a second temperature value of the fluid flowing within said buried channel at the second location, and
compute said flow rate based on a difference value between the first temperature value and the second temperature value.

15. The electronic device according to claim 13, further comprising a pump configured to pump said fluid through the buried channel, said control circuit being operatively coupled to said pump for controlling at least a parameter of said fluid flowing through the buried channel.

16. The electronic device according to claim 3, further comprising:
an infrared radiation absorbing layer arranged over the first temperature sensing element; and
a control circuit coupled to the first temperature sensing element and configured to acquire a sensing signal generated by the first temperature sensing element and to associate the sensing signal to an amount of infrared radiation impinging on said infrared radiation absorbing layer.

17. The electronic device according to claim 16, wherein the control circuit is coupled to end portions of the first and second strip of the first thermocouple element, said sensing signal being a voltage difference across the first and second strip, the control circuit being further configured to associate the voltage difference to the amount of infrared radiation impinging on said infrared radiation absorbing layer.

18. The electronic device according to claim 16, further comprising a pump configured to pump the fluid through the buried channel, said fluid, in use, acting as a coolant for the first temperature sensing element.

* * * * *